United States Patent
Fukuda

(10) Patent No.: US 8,155,161 B2
(45) Date of Patent: Apr. 10, 2012

(54) SEMICONDUCTOR LASER

(75) Inventor: Chie Fukuda, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/794,929

(22) Filed: Jun. 7, 2010

(65) Prior Publication Data

US 2010/0316074 A1    Dec. 16, 2010

(30) Foreign Application Priority Data

Jun. 16, 2009  (JP) .................. 2009-143357

(51) Int. Cl.
*H01S 3/04*   (2006.01)
*H01S 5/00*   (2006.01)

(52) U.S. Cl. .................................... 372/43.01

(58) Field of Classification Search ............ 372/43.01
See application file for complete search history.

(56) References Cited

U.S. PATENT DOCUMENTS

| | | | | |
|---|---|---|---|---|
| 2005/0123018 A1* | 6/2005 | Takagi et al. | ............ | 372/96 |
| 2006/0222039 A1* | 10/2006 | Yamazaki | ............ | 372/94 |

FOREIGN PATENT DOCUMENTS

| | | |
|---|---|---|
| JP | 2006-245346 | 9/2006 |
| JP | 2008-066318 | 3/2008 |

OTHER PUBLICATIONS

Kimoto et al., "Highly Reliable 40-mW 25-GHz×20-ch Thermally Tunable DFB Laser Module, Integrated with Wavelength Monitor", Furukawa Review, No. 24, 2003, pp. 1-5.

* cited by examiner

*Primary Examiner* — Patrick Stafford
(74) *Attorney, Agent, or Firm* — Smith, Gambrell & Russell, LLP

(57) ABSTRACT

A semiconductor laser includes a semiconductor laser region and a wavelength-monitoring region. The semiconductor laser region includes a first optical waveguide that includes a gain waveguide, the first optical waveguide having one end and another end opposite the one end. The wavelength-monitoring region includes a second optical waveguide that is optically coupled to the first optical waveguide with the one end therebetween, and a photodiode structure that is optically coupled to the second optical waveguide. In the wavelength-monitoring region, the second optical waveguide is branched into three or more optical waveguides, and at least two optical waveguides among the three or more optical waveguides form first ring resonators having optical path lengths different from each other.

9 Claims, 14 Drawing Sheets

SEMICONDUCTOR LASER

BACKGROUND OF THE INVENTION

1. Field of the Invention

The present invention relates to a semiconductor laser.

2. Description of the Related Art

Japanese Unexamined Patent Application Publication Nos. 2006-245346 and 2008-066318 disclose wavelength-tunable semiconductor lasers used in optical communication systems. The semiconductor laser disclosed in Japanese Unexamined Patent Application Publication No. 2006-245346 includes a plurality of ring resonators having optical path lengths different from each other, wherein the plurality of ring resonators are optically connected to each other. The semiconductor laser also includes a light input/output unit configured to input and output a laser beam to and from the plurality of ring resonators. These ring resonators have free spectral ranges (FSRs) different from each other. Laser oscillation occurs at a wavelength at which the transmission peak wavelengths of the respective ring resonators overlap each other. Furthermore, the lasing wavelength can be changed by changing the transmission peak wavelengths of the ring resonators by injecting a current into the ring resonators. In this case, a so-called vernier effect is used for changing the lasing wavelength. Furthermore, the lasing wavelength is monitored and it is controlled on the basis of the monitoring results.

In the semiconductor laser disclosed in Japanese Unexamined Patent Application Publication No. 2008-066318, ring resonators are connected at the front and the back of a gain region. The FSRs of these ring resonators are different from each other, and laser oscillation occurs at a wavelength at which the transmission peak wavelengths of the ring resonators overlap each other. The transmission peak wavelengths of the ring resonators can be changed by injecting a current into the ring resonators. That is, as in the semiconductor laser disclosed in Japanese Unexamined Patent Application Publication No. 2006-245346, the lasing wavelength can be changed by injecting a current into the ring resonators using the vernier effect.

Kimoto et al. "Highly Reliable 40-mW 25-GHz×20-ch Thermally Tunable DFB Laser Module, Integrated with Wavelength Monitor", Furukawa Review, No. 24, 2003, pp. 1-5 discloses a laser module provided with a wavelength-tunable DFB laser and a wavelength control element (wavelength locker). The wavelength locker in this laser module includes a prism, two photodiodes, and an etalon filter. In this laser module, the prism branches backlight of the DFB laser into two light beams. The etalon filter receives one of the light beams and selectively passes light of a certain wavelength. One of the photodiodes directly receives the light beams from the DFB laser through the prism. The other of the photodiodes receives the light passing through the etalon filter.

SUMMARY OF THE INVENTION

Recently, in the field of optical communication systems, the amount of information to be transmitted has been increasing. Consequently, wavelength-division multiplexing (WDM) optical transmission systems have been constructed. In such WDM optical transmission systems, a plurality of signal light beams having different wavelengths are transmitted in a single optical fiber. Furthermore, in order to further increase the amount of information to be transmitted, it is desired that the wavelength interval between signal light beams be further reduced. In the conventional WDM optical transmission systems, a plurality of semiconductor lasers having emission wavelengths different from each other are used as an optical transmitter. However, the emission wavelength of each of the semiconductor lasers varies depending on the temperature or a change with time. In order to suppress such a variation in the emission wavelength and to further reduce the wavelength interval between signal light beams, a wavelength-tunable semiconductor laser or a wavelength-locked semiconductor laser can be used. In this case, the emission wavelength of these semiconductor lasers is monitored and the emission wavelength is controlled to be constant on the basis of the monitoring results.

Meanwhile, a further reduction in size has been desired for a transmitter used in optical communication systems. However, for example, in the wavelength-locked semiconductor laser described in Kimoto et al., "Highly Reliable 40-mW 25-GHz×20-ch Thermally Tunable DFB Laser Module, Integrated with Wavelength Monitor", Furukawa Review, No. 24, 2003, pp. 1-5, it is necessary to individually arrange a DFB laser, an etalon filter, and a photodiode and to optically connect these elements to each other with a condenser lens or the like therebetween. As a result, the size of the module is increased. Also, in the wavelength-locked semiconductor laser described in Japanese Unexamined Patent Application Publication No. 2006-245346, it is necessary to arrange a semiconductor laser and a photodiode on a silicon (Si) substrate or quartz substrate on which a multiple-ring resonator is formed, and thus a reduction in size is limited.

A semiconductor laser according to the present invention includes a semiconductor laser region including a first optical waveguide that includes a gain waveguide, the first optical waveguide having one end and another end opposite the one end, and a wavelength-monitoring region including a second optical waveguide that is optically coupled to the first optical waveguide with the one end therebetween and a photodiode structure that is optically coupled to the second optical waveguide. In the wavelength-monitoring region, the second optical waveguide is branched into three or more optical waveguides, and at least two optical waveguides among the three or more optical waveguides form first ring resonators having optical path lengths different from each other.

In this semiconductor laser, light emitted from the gain waveguide of the semiconductor laser region propagates in the first optical waveguide and optically coupled to the second optical waveguide that is formed in the wavelength-monitoring region, with the one end of the first optical waveguide therebetween. This light is branched into three or more optical waveguides. Light propagating in at least two optical waveguides among the three or more optical waveguides passes through first ring resonators respectively provided in the at least two optical waveguides and is detected by the photodiode structure.

In addition, ring resonators constituting the first ring resonators have optical path lengths different from each other. Accordingly, the periods of transmission peak wavelengths of the ring resonators are also different from each other. Accordingly, even when the emission wavelength is varied outside the free spectral range (FSR) of one ring resonator included in the first ring resonators by, for example, mode hopping or long-term degradation, the variation in the wavelength can be corrected by monitoring the intensity of light passing through another ring resonator. According to the semiconductor laser described above, the emission wavelength can be controlled to be a constant wavelength with high accuracy even in the case where the emission wavelength significantly varies.

In the above semiconductor laser, the semiconductor laser region may include a reflector region forming one reflecting mirror of a laser cavity, the reflector region being provided at the one end of the first optical waveguide.

Furthermore, the reflector region may include a pair of films having a refractive index lower than the refractive index of the first optical waveguide. The pair of films extends in an in-plane direction perpendicular to the optical axis of the first optical waveguide, and forms an optical reflector of the first optical waveguide.

In this semiconductor laser, the one reflecting mirror of the laser cavity may include, in the reflector region, a pair of films having a refractive index lower than the refractive index of the first optical waveguide. The pair of films extends in the in-plane direction perpendicular to the optical axis of the first optical waveguide. Accordingly, the reflecting mirror forming the laser cavity does not use a crystal end facet formed by cleaving a semiconductor substrate. Accordingly, the semiconductor laser region and the wavelength-monitoring region can be monolithically integrated on the same semiconductor substrate.

In the semiconductor laser, the pair of films may be composed of at least one selected from silicon dioxide ($SiO_2$), silicon nitride (SiN), and a benzocyclobutene (BCB) resin. Since the refractive index of these materials is lower than the refractive index of semiconductors, the pair of films having a refractive index lower than the refractive index of the optical waveguide can be suitably realized.

In the semiconductor laser, the semiconductor laser region may include a light reflection portion including a diffraction grating formed along the first optical waveguide and a plurality of electrodes arranged in the light-propagation direction of the first optical waveguide, the light reflection portion being provided at one end side of the gain waveguide, a light transmission portion provided at another end side of the gain waveguide, the light transmission portion having a plurality of transmission peaks that periodically change with a predetermined period, and a phase control portion for controlling the optical path length of the first optical waveguide. Furthermore, the diffraction grating of the light reflection portion may have a period that changes in a light-propagation direction of the first optical waveguide, and the light reflection portion may form another reflecting mirror of the laser cavity. With this structure, the reflector region formed at the one end of the first optical waveguide and the light reflection portion provided at the one end side of the gain waveguide form a laser cavity, and the semiconductor laser region can have a wavelength-tunable laser structure. Consequently, the semiconductor laser according to the present invention is suitable for the WDM optical transmission systems as a tunable light source.

In this case, the light transmission portion of the semiconductor laser may include a second ring resonator formed by the first optical waveguide. Accordingly, the wavelength-transmittance characteristics in which the transmittance periodically changes with a predetermined period can be suitably realized.

The wavelength-monitoring region of the semiconductor laser may include a plurality of photodiode structures, and the optical waveguides branched from the second optical waveguide may be optically coupled to the photodiode structures.

In the semiconductor laser, the optical path lengths of the first ring resonators are preferably determined so that the period of transmission peak wavelengths in one of the first ring resonators formed by the at least two optical waveguides is more than two times the period of transmission peak wavelengths of another one of the first ring resonators. In this case, even when the emission wavelength is varied outside the FSR of the one of the first ring resonators, the variation in the wavelength can be easily recognized by monitoring the intensity of light passing through the other one of the first ring resonators.

The semiconductor laser may further include a semiconductor substrate, and the semiconductor laser region and the wavelength-monitoring region may be provided on the semiconductor substrate. With this structure, a further reduction in size can be realized as compared with the conventional wavelength-locked semiconductor laser.

In the semiconductor laser, the semiconductor laser region may have a distributed feedback laser structure including a diffraction grating formed along the gain waveguide. Furthermore, the diffraction grating formed along the gain waveguide preferably has a uniform period.

DESCRIPTION OF THE PREFERRED EMBODIMENTS

Figure 1:
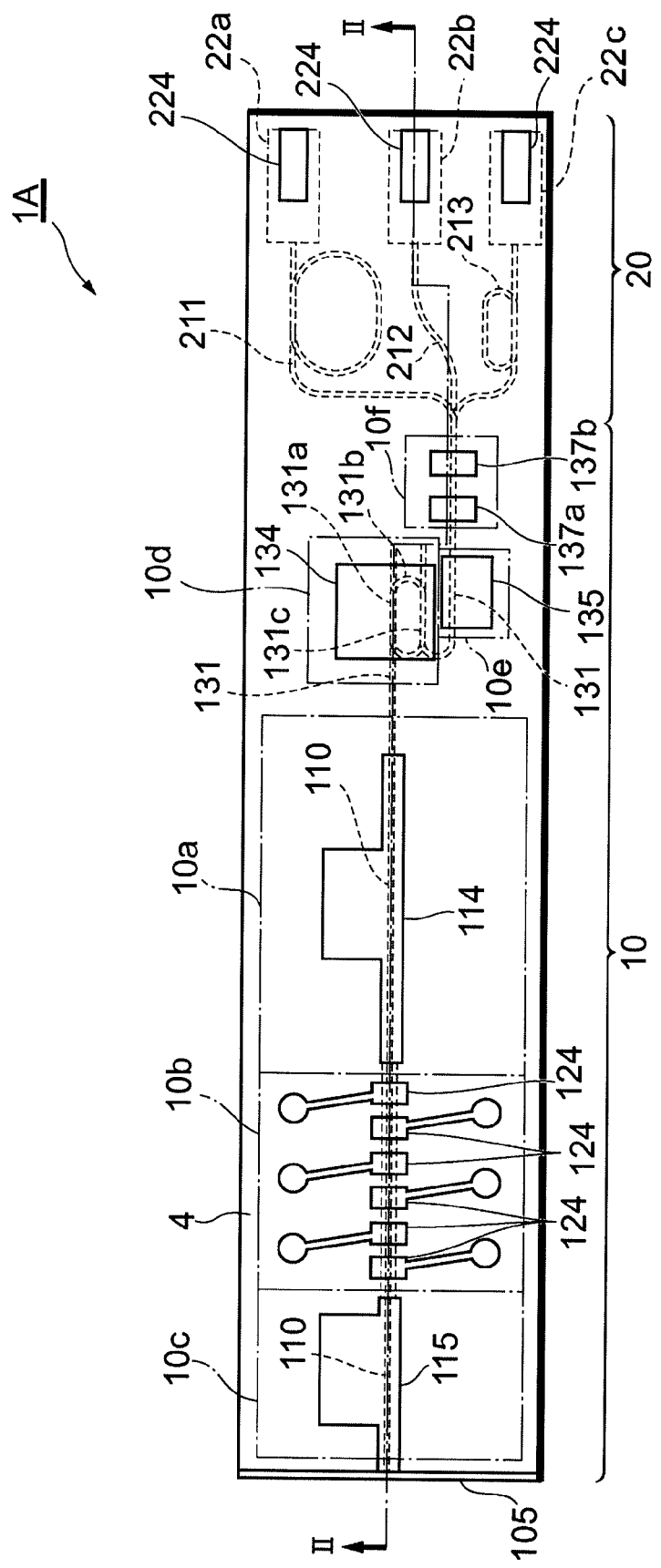
FIG. 1 is a plan view showing the structure of a semiconductor laser according to a first embodiment of the present invention.

Semiconductor lasers according to embodiments of the present invention will be described in detail below with reference to the accompanying drawings. In descriptions of the drawings, the same elements are assigned the same reference numerals and an overlapping description is omitted.

First Embodiment

Figure 2:
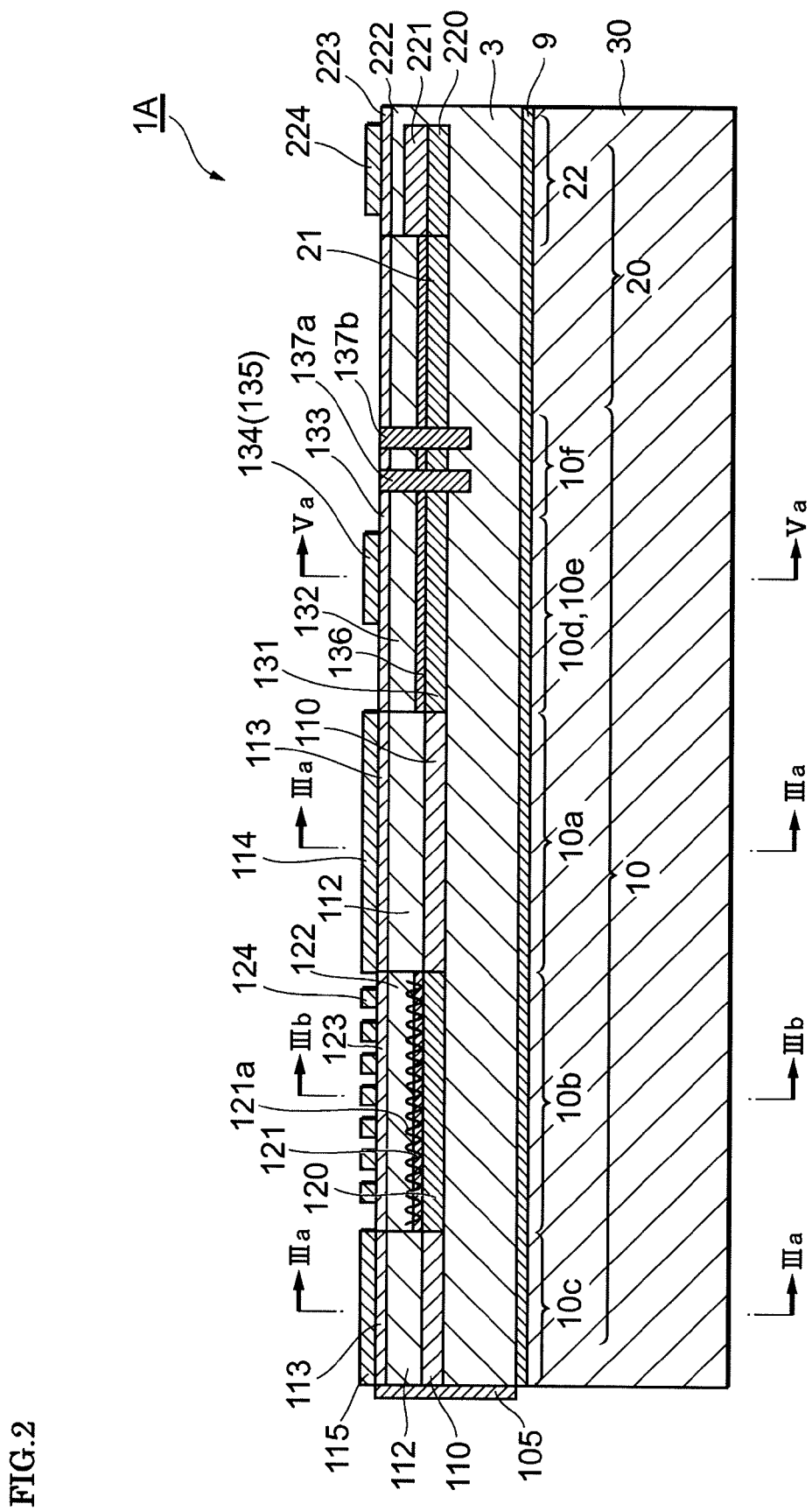
FIG. 2 is a cross-sectional side view of the semiconductor laser taken along line II-II in FIG. 1.

A semiconductor laser according to a first embodiment of the present invention will now be described. Referring to FIGS. 1 and 2, the semiconductor laser 1A includes a semiconductor laser region 10 and a wavelength-monitoring region 20. Furthermore, the semiconductor laser region 10 and the wavelength-monitoring region 20 are formed by being integrated on a single semiconductor substrate. The semiconductor laser region 10 has a wavelength-tunable semiconductor laser structure. The semiconductor laser region 10 includes a gain region 10a, a distributed Bragg reflector (DBR) region 10b, an optical amplification region 10c, a ring resonator region 10d, a phase control region (phase control portion) 10e, and a reflector region 10f. In the wavelength-monitoring region 20, light passing through the reflector region 10f of the semiconductor laser region 10 is branched into, for example, three light beams propagating in three optical waveguides, respectively. In the branched light beams, the two light beams propagating in the two optical waveguides pass through a ring resonator and are connected to photodiode structures 22a and 22c, respectively. The other of the branched light beams propagating in the other optical waveguide is directly connected to another photodiode structure 22b. The monitoring results (photo-current signals) obtained from the photodiode structures 22a, 22b, and 22c in the wavelength-monitoring region 20 are used to control the emission wavelength of the semiconductor laser region 10.

The semiconductor laser region 10 and the wavelength-monitoring region 20 are formed on a single semiconductor substrate 3 as shown in FIG. 1, and are arranged in a light-propagation direction. Preferable lengths of the semiconductor laser region 10 and the wavelength-monitoring region 20 in the light-propagation direction are 1,500 μm and 1,000 μm, respectively. The semiconductor substrate 3 is composed of, for example, n-type InP and functions as a lower cladding layer of an optical waveguide in the semiconductor laser region 10 and the wavelength-monitoring region 20.

In addition, the semiconductor laser 1A is mounted on a temperature control device 30. The temperature control device 30 includes, for example, a Peltier device (thermoelectric cooling device). The temperature of the semiconductor substrate 3 and a stacked structure provided on the main surface of the semiconductor substrate 3 can be controlled to a predetermined temperature using the temperature control device 30.

Figure 3A:
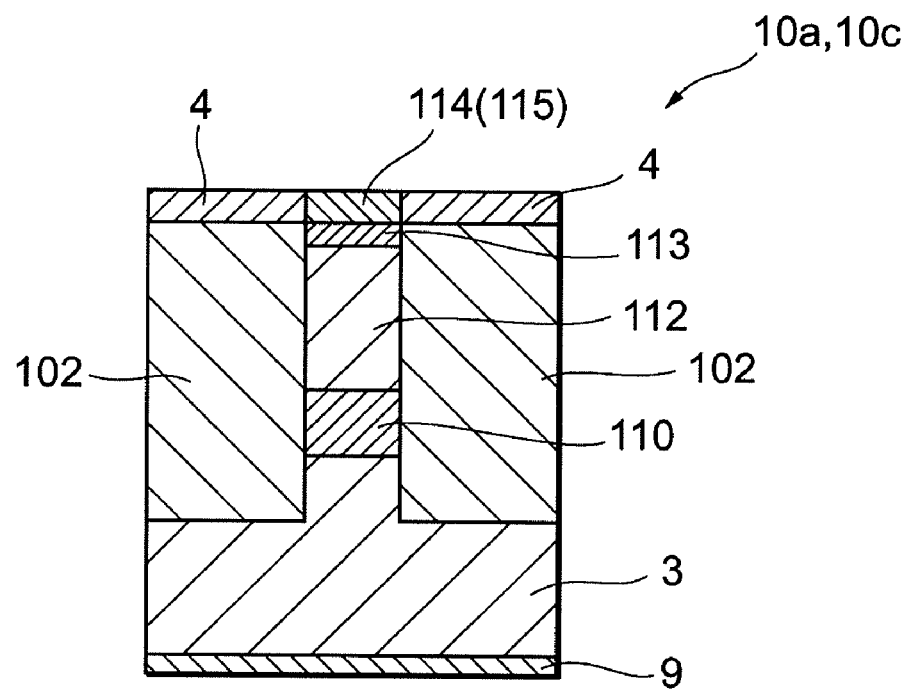
FIG. 3A is a cross-sectional view of a semiconductor laser region taken along line IIIa-IIIa in FIG. 2 and shows the structure of a gain region and an optical amplification region.
Figure 3B:
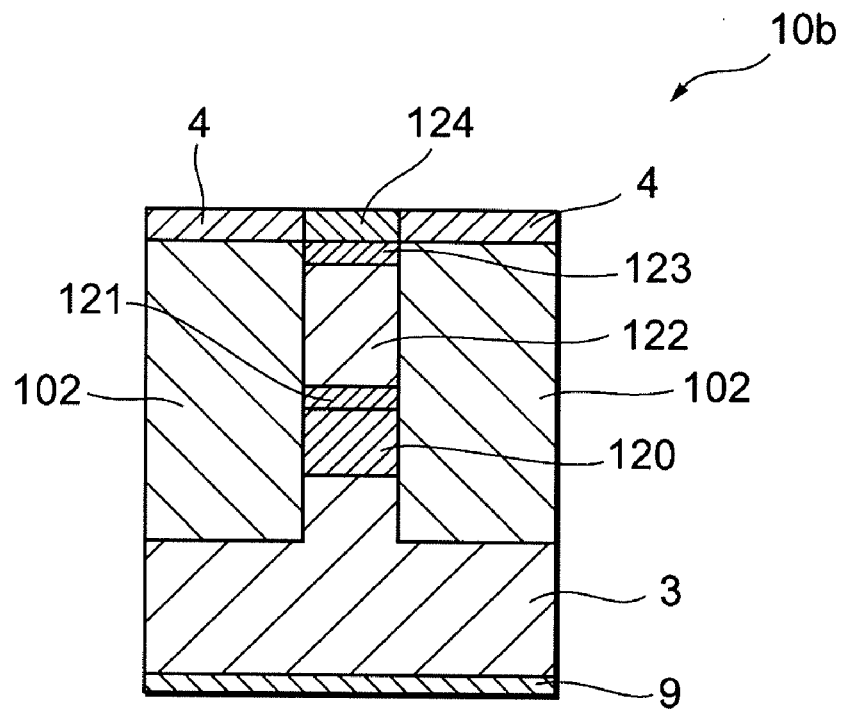
FIG. 3B is a cross-sectional view of the semiconductor laser region taken along line IIIb-IIIb in FIG. 2 and shows the structure of a distributed Bragg reflector (DBR) region.

First, the structure of the gain region 10a, the DBR region 10b, and the optical amplification region 10c in the semiconductor laser region 10 will be described with reference to FIGS. 1, 2, 3A, and 3B. FIG. 3A is a cross-sectional view of the semiconductor laser region 10 taken along line IIIa-IIIa in FIG. 2 and shows the structure of the gain region 10a and the optical amplification region 10c. FIG. 3B is a cross-sectional view of the semiconductor laser region 10 taken along line IIIb-IIIb in FIG. 2 and shows the structure of the DBR region 10b. In FIGS. 3A and 3B, the illustration of the temperature control device 30 shown in FIG. 2 is omitted.

Each of the gain region 10a and the optical amplification region 10c includes an optical waveguide layer 110 provided on the semiconductor substrate 3, an upper cladding layer 112 provided on the optical waveguide layer 110, and a contact layer 113 provided on the upper cladding layer 112. The optical waveguide layer 110 constitutes a part of a first optical waveguide in this embodiment. In particular, the optical waveguide layer 110 of the gain region 10a corresponds to a gain waveguide (i.e., waveguide having an optical gain) in this embodiment. The optical waveguide layer 110 is composed of a semiconductor having a band-gap wavelength longer than (i.e., having a band-gap energy smaller than) that of the semiconductor substrate 3 and extends in the light-propagation direction along the main surface of the semiconductor substrate 3. Here, the band-gap wavelength $\lambda g$ (μm) and the band-gap energy Eg (eV) are related by the relationship $\lambda g=1.24/Eg$. The optical waveguide layer 110 includes, for example, a lower optical confinement layer, an upper optical confinement layer and an active layer provided between the lower optical confinement layer and the upper optical confinement layer.

Figure 4A:
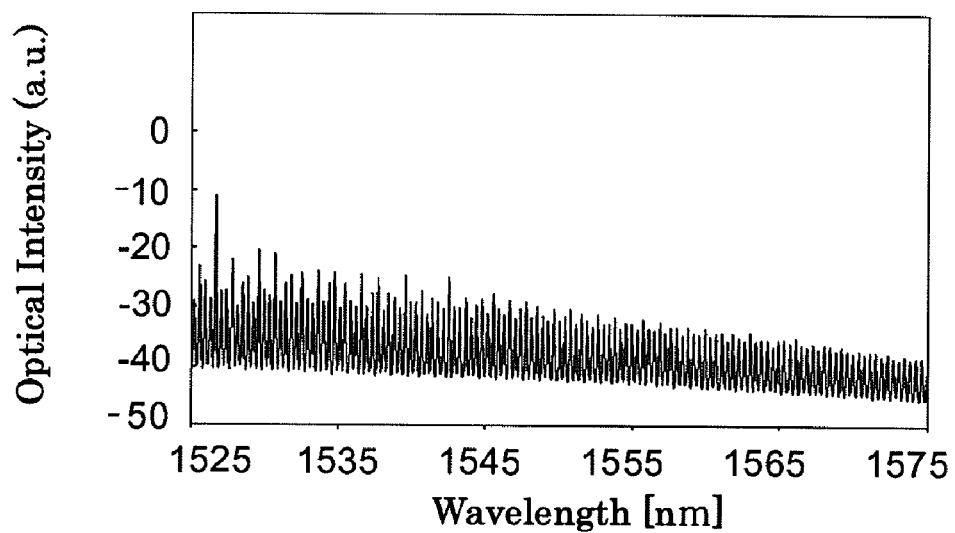
FIG. 4A is a graph showing an example of an emission spectrum at injecting a current into the gain region.

In an example, each of the lower optical confinement layer and the upper optical confinement layer is composed of undoped GaInAsP, and the active layer has a GaInAsP multi-quantum well (MQW) structure. The composition of the active layer is adjusted so that light with a wavelength of, for example, 1.52 to 1.57 μm is emitted (or amplified). FIG. 4A is a graph showing an example of an emission spectrum when a current is injected into the gain region 10a. In FIG. 4A, the vertical axis represents the optical intensity, and the horizontal axis represents the wavelength. As shown in FIG. 4A, light over a relatively wide wavelength range is emitted from the gain region 10a. That is, the gain region 10a has an optical gain over a relatively wide wavelength range corresponding to the emission spectrum. The optical waveguide layer 110 has a thickness of, for example, 0.3 μm.

The upper cladding layer 112 is composed of p-type InP, and the contact layer 113 is composed of p-type GaInAs. The upper cladding layer 112 and the contact layer 113 have thicknesses of, for example, 2 μm and 0.2 μm, respectively.

The optical waveguide layer 110, the upper cladding layer 112, and the contact layer 113 have a stripe-shaped mesa structure on the semiconductor substrate 3, the stripe-shaped mesa structure extending in the light-propagation direction (refer to FIG. 3A). The width of the stripe-shaped mesa structure in a direction intersecting with the light-propagation direction is, for example, 1.5 μm. A semi-insulating portion 102 is provided on each side face of this stripe-shaped mesa structure. The semi-insulating portion 102 is composed of a semi-insulating semiconductor, for example, Fe-doped InP. The semi-insulating portion 102 is also provided on a portion of the semiconductor substrate 3, the portion being other than the stripe-shaped mesa structure.

An anode electrode 114 is provided on the contact layer 113 of the gain region 10a, and an anode electrode 115 is provided on the contact layer 113 of the optical amplification region 10c. The anode electrodes 114 and 115 are ohmic electrodes composed of, for example, Ti/Pt/Au. A cathode electrode 9 is provided on the reverse face of the semiconductor substrate 3. The cathode electrode 9 is an ohmic electrode composed of, for example, AuGe. A current is injected into the optical waveguide layer 110 through the anode electrodes 114 and 115 and the cathode electrode 9. Portions of the upper surfaces of the gain region 10a and the optical amplification region 10c, the portions being other than those of the anode electrodes 114 and 115, are covered with an insulating film 4 composed of, for example, $SiO_2$.

As shown in FIGS. 1 and 2, an anti-reflection (AR) film 105 is provided on an end facet of the optical amplification region 10c in the light-propagation direction (i.e., on the light-emitting end facet of the semiconductor laser region 10). The reflectivity of this AR film 105 is, for example, 0.1%.

The DBR region 10b constitutes a light reflection portion in this embodiment. The DBR region 10b is provided at one end side of the optical waveguide layer 110 of the gain region 10a. A reflection spectrum of the DBR region 10b has a plurality of reflectivity peaks that periodically change with a predetermined period.

The DBR region 10b includes an optical waveguide layer 120 provided on the semiconductor substrate 3, a diffraction grating layer 121 provided on the optical waveguide layer 120, an upper cladding layer 122 provided on the diffraction grating layer 121, and a contact layer 123 provided on the upper cladding layer 122. The optical waveguide layer 120 constitutes a part of the first optical waveguide in this embodiment. The band-gap wavelength of the optical waveguide layer 120 is shorter than the band-gap wavelength of the active layer of the gain region 10a and is, for example, 1.3 μm or less. The refractive index of the optical waveguide layer 120 changes in accordance with the magnitude of the current injected into the optical waveguide layer 120 through a cathode electrode 9 and anode electrodes 124 described below. The optical waveguide layer 120 is composed of a semiconductor having a band-gap wavelength longer than that of the semiconductor substrate 3. The optical waveguide layer 120 extends in the light-propagation direction along the main surface of the semiconductor substrate 3. One end of the optical waveguide layer 120 is coupled to the optical waveguide layer 110 of the gain region 10a, and another end of the optical waveguide layer 120 is optically coupled to the optical waveguide layer 110 of the optical amplification region 10c.

The diffraction grating layer 121 is provided along the optical waveguide layer 120. In this embodiment, the diffraction grating layer 121 is provided directly on the optical waveguide layer 120. In order to effectively confine light mainly in the optical waveguide layer 120, the band-gap wavelength of the diffraction grating layer 121 is preferably shorter than the band-gap wavelength of the optical waveguide layer 120, and is 1.2 μm, for example.

A diffraction grating 121a (refer to FIG. 2) is formed at an interface between the diffraction grating layer 121 and the upper cladding layer 122. The diffraction grating 121a is formed along the optical waveguide layer 120 and is a so-called chirped grating in which the grating period thereof changes in the light-propagation direction of the optical waveguide layer 120.

In an example, the optical waveguide layer 120 and the diffraction grating layer 121 are each composed of undoped GaInAsP, and have thicknesses of, for example, 0.3 μm and 50 nm, respectively. The upper cladding layer 122 is composed of p-type InP, and the contact layer 123 is composed of p-type GaInAs. The upper cladding layer 122 and the contact layer 123 have thicknesses of, for example, 2 μm and 0.2 μm, respectively.

The optical waveguide layer 120, the upper cladding layer 122, and the contact layer 123 also have a stripe-shaped mesa structure on the semiconductor substrate 3, the stripe-shaped mesa structure extending in the light-propagation direction (refer to FIG. 3B) as in the optical waveguide layer 110 and other layers of the gain region 10a and the optical amplification region 10c. The width of the stripe-shaped mesa structure in a direction intersecting with the light-propagation direction is the same as that of the stripe-shaped mesa structure of the gain region 10a and the optical amplification region 10c. In addition, both side faces of this stripe-shaped mesa structure are covered by the same semi-insulating portion 102 as that of the gain region 10a and the optical amplification region 10c.

A plurality of anode electrodes 124 are provided on the contact layer 123. The plurality of anode electrodes 124 are arranged on the contact layer 123 in the light-propagation direction at predetermined intervals. The anode electrodes 124 are ohmic electrodes composed of, for example, Ti/Pt/Au. A current can be injected into portions of the optical waveguide layer 120 selectively through the respective anode electrodes 124 and the cathode electrode 9 provided on the reverse face of the semiconductor substrate 3. A portion of the upper surface of the DBR region 10b, the portion being other than that of the plurality of anode electrodes 124, is covered with the same insulating film 4 as that of the gain region 10a and the optical amplification region 10c.

Figure 4B:
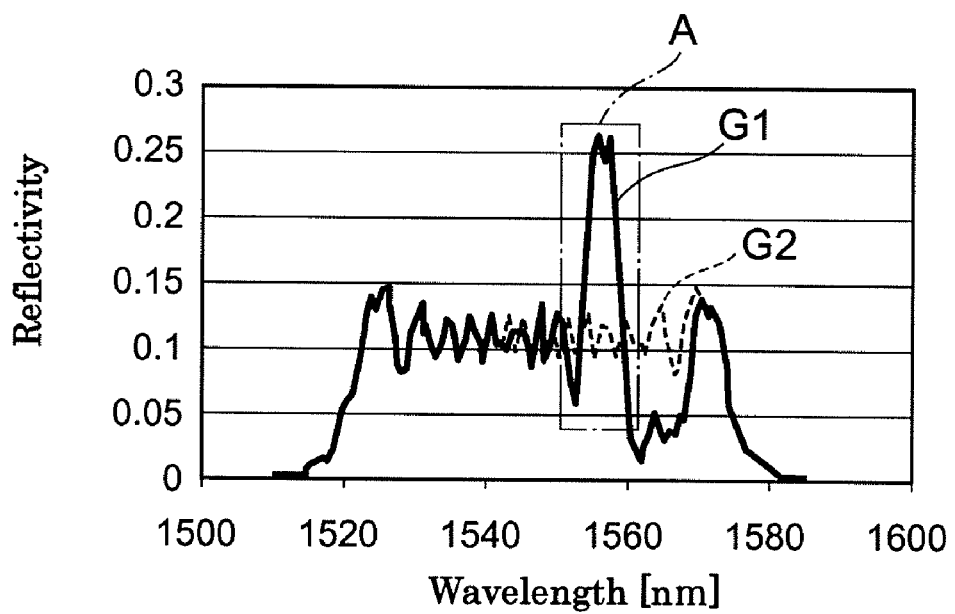
FIG. 4B is a graph showing an example of a reflection spectrum of the DBR region at injecting a current from one of a plurality of anode electrodes to an optical waveguide layer and a diffraction grating layer.

Graph G1 shown in FIG. 4B is a graph showing an example of a reflection spectrum of the DBR region 10b when a current is injected from one of the anode electrodes 124 to the optical waveguide layer 120 and the diffraction grating layer 121. In FIG. 4B, the vertical axis represents the reflectivity, and the horizontal axis represents the wavelength. Graph G2 shown by the broken line in FIG. 4B shows a reflection spectrum of the DBR region 10b when a current is not supplied to any of the plurality of anode electrodes 124.

When a power supply is connected from the outside to one of the plurality of anode electrodes 124 and a current is supplied thereto, the refractive index of the optical waveguide layer 120 and diffraction grating layer 121 located right under the anode electrode 124 changes, and the reflectivity of the diffraction grating 121a in the wavelength range corresponding to the grating period of the current-injected portion of the diffraction grating 121a can be increased. In contrast, the reflectivity of the diffraction grating 121a does not change in other wavelength range corresponding to the grating period of the portions in which the refractive index does not change. Accordingly, as shown in FIG. 4B, in the reflection spectrum of the DBR region 10b, the reflectivity in the wavelength range (portion A in the figure) corresponding to the grating period of the diffraction grating 121a located right under the anode electrode 124 to which the current is supplied becomes selectively high. In this embodiment, a current can be independently supplied to each of the plurality of anode electrodes 124. Accordingly, by supplying a current to any one of the anode electrodes 124, the reflectivity in a desired wavelength range can be increased, thereby limiting the lasing wavelength within this wavelength range. Note that the number of anode electrodes 124 to which a current is supplied at the same time is not limited to one. Alternatively, the current may be supplied to two or more anode electrodes 124 at the same time.

Figure 5A:
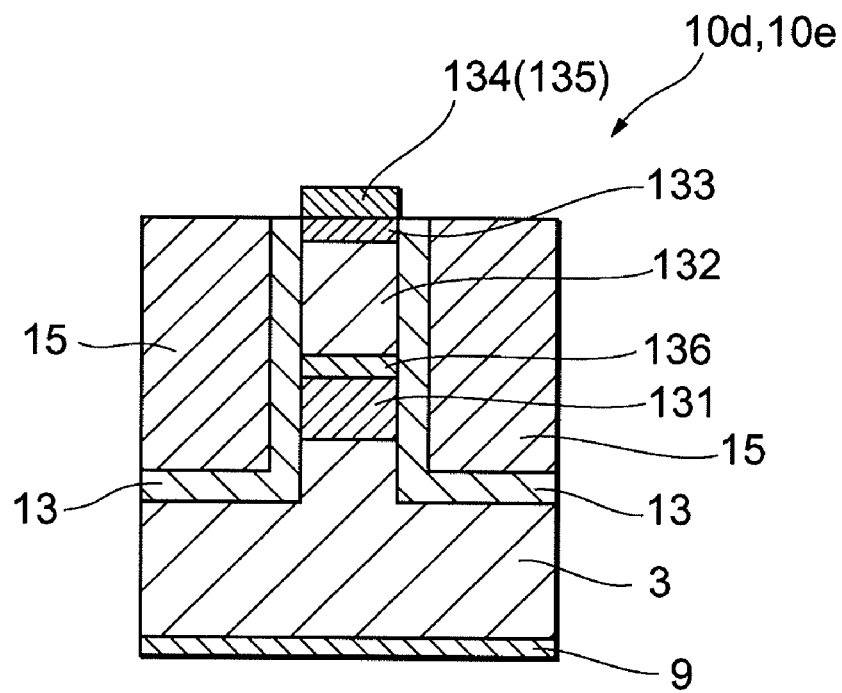
FIG. 5A is a cross-sectional view of the semiconductor laser region taken along line Va-Va in FIG. 2 and shows the structure of a ring resonator region and a phase control region.

Next, the structure of the ring resonator region 10d and the phase control region 10e in the semiconductor laser region 10 will be described with reference to FIGS. 1,2, and 5A. FIG. 5A is a cross-sectional view of the semiconductor laser region 10 taken along line Va-Va and shows the structure of the ring resonator region 10d and the phase control region 10e. In FIG. 5A, the illustration of the temperature control device 30 shown in FIG. 2 is omitted.

The ring resonator region 10d constitutes a light transmission portion in this embodiment. Specifically, the ring resonator region 10d is provided at another end side of the optical waveguide layer 110 of the gain region 10a. The transmittance of the ring resonator region 10d periodically changes with a predetermined period. The phase control region 10e is a region for controlling the optical path length of the optical waveguide in the semiconductor laser region 10 to adjust the phase of light propagating in the optical waveguide. The cross-sectional structure of the phase control region 10e is the same as that of the ring resonator region 10d.

As shown in FIG. 5A, each of the ring resonator region 10d and the phase control region 10e includes an optical waveguide layer 131, an upper cladding layer 132, and a contact layer 133 that are sequentially stacked on the semiconductor substrate 3. Furthermore, the ring resonator region 10d includes an anode electrode 134, and the phase control region 10e includes an anode electrode 135. The cathode electrode 9 provided on the reverse face of the semiconductor substrate 3 is also used as a cathode electrode of the ring resonator region 10d and the phase control region 10e. In addition, a semiconductor layer 136 having the same composition as the diffraction grating layer 121 of the DBR region 10b is provided between the optical waveguide layer 131 and the upper cladding layer 132. However, the interface between the semiconductor layer 136 and the upper cladding layer 132 is flat, and periodic projections and recesses for a diffraction grating are not formed on the interface.

The optical waveguide layer 131 is provided on the main surface of the semiconductor substrate 3 and functions as an optical waveguide in the ring resonator region 10d and the phase control region 10e to constitute a part of the first optical waveguide in this embodiment. One end of the optical waveguide layer 131 of the ring resonator region 10d is optically coupled to the optical waveguide layer 110 of the gain region 10a. One end of the optical waveguide layer 131 of the phase control region 10e is optically coupled to another end of the optical waveguide layer 131 of the ring resonator region 10d. The refractive index of these optical waveguide layers 131 changes in accordance with the magnitude of a current injected into the optical waveguide layers 131 through the cathode electrode 9 and the anode electrode 134 or 135.

In one example, the optical waveguide layer 131 and the semiconductor layer 136 are each composed of undoped GaInAsP, and have thicknesses of, for example, 0.3 µm and 50 nm, respectively. The band-gap wavelength of the optical waveguide layer 131 is shorter than the band-gap wavelength of the active layer of the gain region 10a and is, for example, 1.3 µm or less. The upper cladding layer 132 is composed of p-type InP, and the contact layer 133 is composed of p-type GaInAs. The upper cladding layer 132 and the contact layer 133 have thicknesses of, for example, 2 µm and 0.2 µm, respectively.

The optical waveguide layer 131, the upper cladding layer 132, and the contact layer 133 constitute a mesa structure. The upper surface and both side faces of the mesa structure are covered with an insulating film 13 composed of, for example, $SiO_2$. The insulating film 13 is provided so as to extend from the two side faces of the mesa structure to the main surface of the semiconductor substrate 3. The insulating film 13 has a thickness of, for example, 0.3 µm.

A resin layer 15 is provided on the insulating film 13 extending along the two side faces of the mesa structure. The resin layer 15 is composed of, for example, a benzocyclobutene (BCB) resin and has a thickness in the range of, for example, 1 to 2 µm.

The anode electrodes 134 and 135 are provided on the contact layer 133 and are ohmic electrodes composed of, for example, Ti/Pt/Au. A current can be injected into the respective optical waveguide layers 131 of the ring resonator region 10d and the phase control region 10e through the anode electrode 134 or 135 and the cathode electrode 9.

As shown in FIG. 1, the optical waveguide layer 131 of the ring resonator region 10d includes an optical waveguide portion 131a extending on the optical axis of the gain region 10a, a ring-shaped portion 131b optically coupled to the optical waveguide portion 131a by using a multimode interference (MMI) coupler, and an optical waveguide portion 131c optically coupled to the ring-shaped portion 131b by using an MMI coupler. An end of the optical waveguide portion 131c (i.e., another end of the ring resonator) is optically coupled to the optical waveguide layer 131 of the phase control region 10e.

Figure 5B:
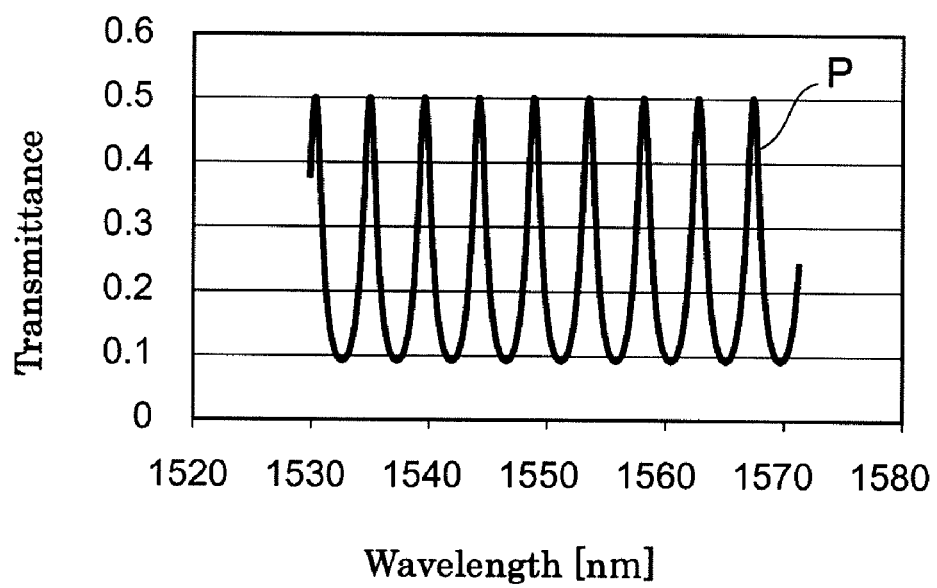
FIG. 5B is a graph showing an example of a transmission spectrum of the ring resonator region.

Since the optical waveguide layer 131 is provided with the structure of a ring resonator (i.e., a second ring resonator in this embodiment), a transmission spectrum thereof periodically changes with a predetermined period and has a plurality of discrete transmission peak wavelengths. FIG. 5B is a graph showing an example of a transmission spectrum of the ring resonator region 10d. In FIG. 5B, the vertical axis represents the light transmittance and the horizontal axis represents the wavelength. As shown in FIG. 5B, the transmission spectrum of the ring resonator region 10d has a plurality of transmission peaks P, and the wavelength interval (period) between the transmission peaks P is, for example, 4.5 nm. The peak transmittance of each of the transmission peaks P is, for example, 40% or more and 85% or less.

The transmission peak wavelengths of this ring resonator are shifted by a change in the refractive index of the optical waveguide layer 131. The refractive index of the optical waveguide layer 131 changes in accordance with the magnitude of the current injected into the optical waveguide layer 131 through the cathode electrode 9 and the anode electrode 134. This ring resonator receives light components transmitted from the gain region 10a at the ring resonator region 10d. Then, the ring resonator selectively transmits only wavelength components corresponding to the above transmission peaks P to the phase control region 10e. As a result, only the wavelength components that have been selectively transmitted through the ring resonator contribute to the laser oscillation. Accordingly, the lasing wavelength of the semiconductor laser region 10 can be adjusted by adjusting the magnitude of the current injected into the optical waveguide layer 131 of the ring resonator.

The refractive index of the optical waveguide layer 131 of the phase control region 10e changes in accordance with the magnitude of the current injected into the optical waveguide layer 131 of the phase control region 10e through the cathode electrode 9 and the anode electrode 135. The optical path length in the phase control region 10e is changed by the change in the refractive index of the optical waveguide layer 131, thus controlling the phase of light propagating in the optical waveguide. As a result, the lasing wavelength of the semiconductor laser region 10 can also be adjusted by controlling the magnitude of the current injected into the optical waveguide layer 131 of the phase control region 10e. In general, a range of the lasing wavelength of the semiconductor laser region 10 that can be adjusted by injecting a current into the optical waveguide layer 131 of the phase control region 10e is smaller than a range of the lasing wavelength that can be adjusted by injecting a current into the optical waveguide layer 131 of the ring resonator. Accordingly, the adjustment of the lasing wavelength of the semiconductor laser region 10 performed by injecting a current into the optical waveguide layer 131 of the phase control region 10e is used for finely adjusting the lasing wavelength.

Figure 6A:
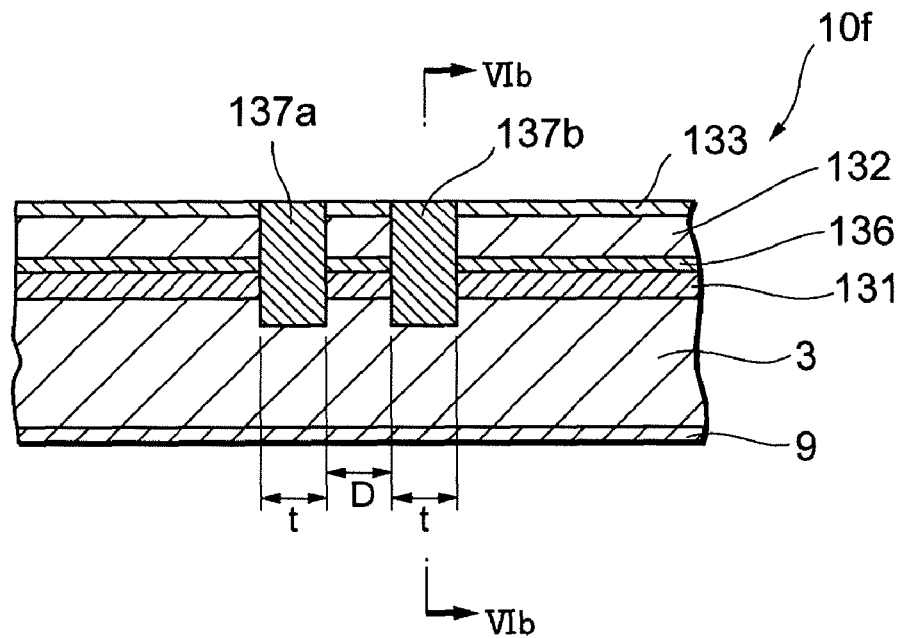
FIG. 6A is an enlarged cross-sectional side view of a reflector region shown in FIG. 2.
Figure 6B:
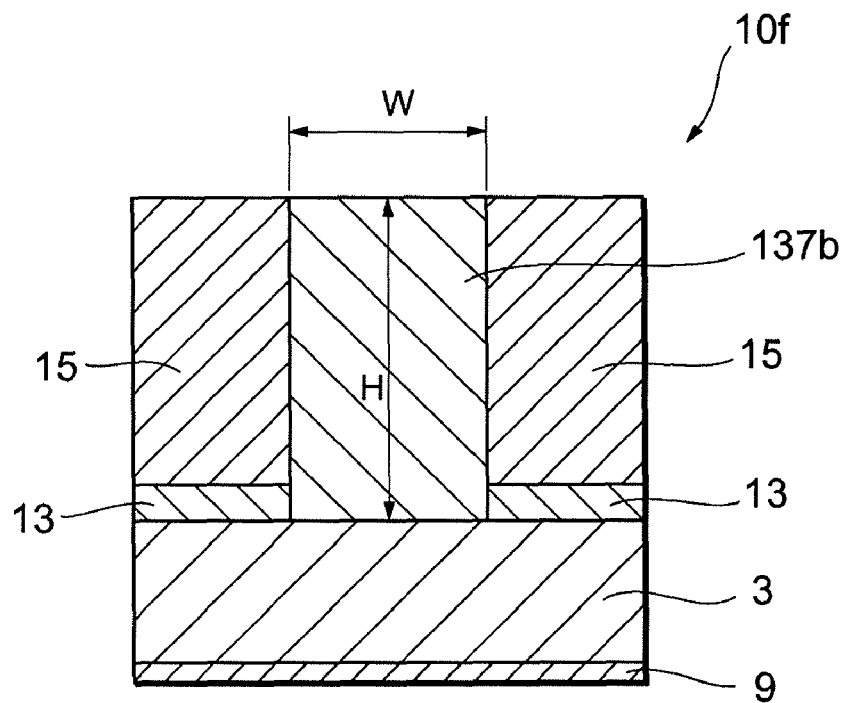
FIG. 6B is a cross-sectional view of the reflector region taken along line VIb-VIb in FIG. 6A.

Next, the structure of the reflector region 10f in the semiconductor laser region 10 will be described with reference to FIGS. 6A and 6B. FIG. 6A is an enlarged cross-sectional side view of the reflector region 10f shown in FIG. 2. FIG. 6B is a cross-sectional view of the reflector region 10f taken along line VIb-VIb in FIG. 6A. The reflector region 10f includes a pair of films 137a and 137b described below to form an optical reflector of the semiconductor laser region 10.

As shown in FIG. 6A, the reflector region 10f includes an optical waveguide layer 131, a semiconductor layer 136, an upper cladding layer 132, and a contact layer 133 that are sequentially stacked on the semiconductor substrate 3. The structures of these layers are the same as those of the phase control region 10e described above. The optical waveguide layer 131, the upper cladding layer 132, and the contact layer 133 constitute a mesa structure as in the phase control region 10e. Both side faces of the mesa structure are covered with an insulating film 13, and a resin layer 15 is provided along the two side faces of the mesa structure. The optical waveguide layer 131 functions as an optical waveguide in the reflector region 10f to constitute a part of the first optical waveguide in this embodiment. An end of the optical waveguide layer 131 is optically coupled to another end of the optical waveguide layer 131 of the phase control region 10e.

The reflector region 10f includes the pair of films 137a and 137b. The films 137a and 137b are provided so as to intersect with the optical waveguide layer 131 and to extend in an in-plane direction perpendicular to the optical axis of the optical waveguide layer 131. The films 137a and 137b are formed with a predetermined distance therebetween in the optical axis direction and face each other. The films 137a and 137b are composed of a material that has a refractive index lower than the refractive index of the optical waveguide layer 131 and that does not absorb light (having a wavelength of 1.5 to 1.6 µm) propagating in the optical waveguide layer 131. For example, the films 137a and 137b are composed of at least one selected from $SiO_2$, SiN, and a BCB resin. Such films 137a and 137b intersect with the optical axis of the optical waveguide layer 131, whereby the pair of films 137a and 137b forms an optical reflector of the first optical waveguide including the optical waveguide layer 131.

The reflectivity of the optical reflector formed from the pair of films 137a and 137b is determined by thicknesses t in the optical axis direction and the refractive indices of the films 137a and 137b, respectively. When the thickness t of the film 137a or the film 137b is too small, it is difficult to form these films (film 137a or film 137b). When the thickness t of the film 137a or the film 137b is too large, the loss of light becomes large. Accordingly, the thickness t of the film 137a or the film 137b is determined also in consideration of these conditions.

As shown in FIGS. 6A and 6B, the thickness t of the film 137a or the film 137b in the optical axis direction is, for example, 807.3 nm, respectively. A width W of the film 137a or the film 137b in a plane perpendicular to the optical axis is, for example, 5 µm, respectively and a height H of the film 137a or the film 137b in a direction perpendicular to the main surface of the semiconductor substrate 3 is, for example, 5 µm, respectively. When the wavelength of light is in a 1.55- µm wavelength range, a distance D between the film 137a and the film 137b is, for example, 325.6 nm. When the film 137a and the film 137b are composed of $SiO_2$, the refractive index of these films (film 137a and film 137b) to light having a wavelength of 1.55 µm is 1.444. The effective refractive index of the optical waveguide layer 131 to light having the same wavelength is, for example, 3.57.

Figure 7:
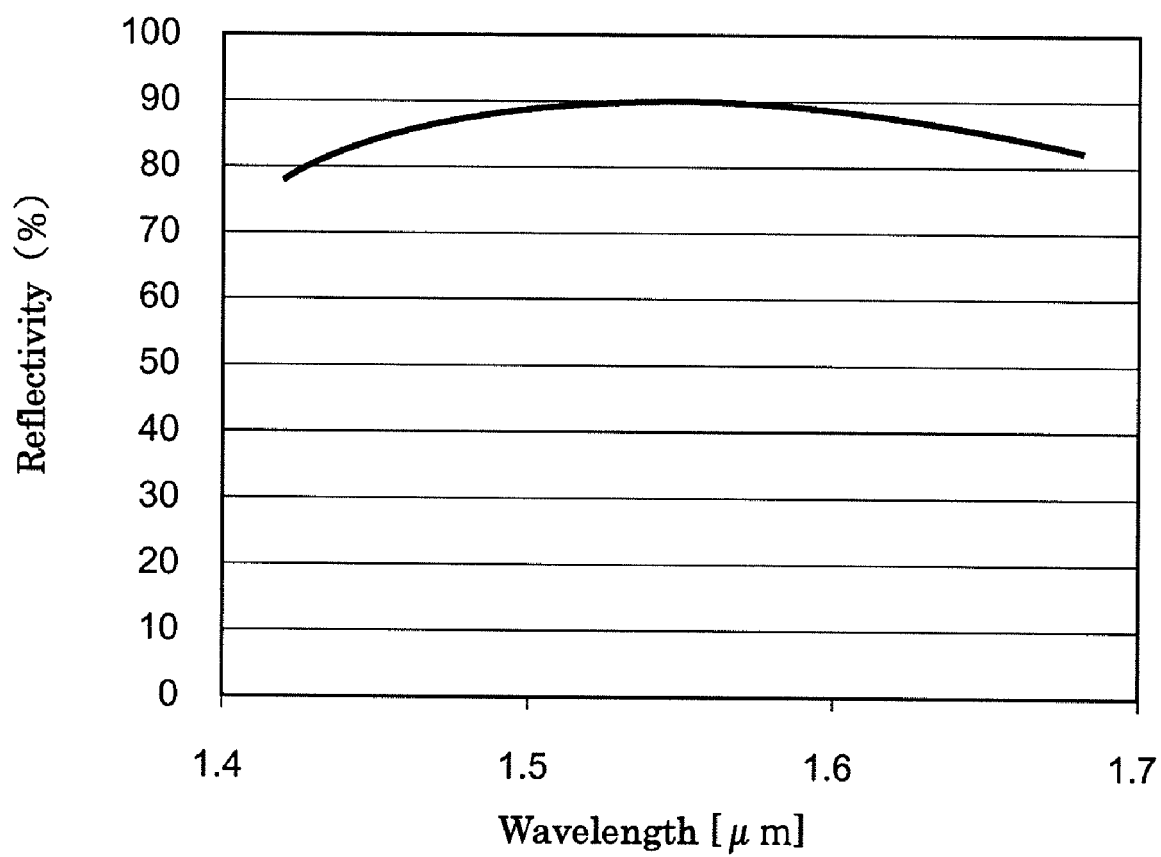
FIG. 7 is a graph showing an example of a reflection spectrum of a film structure including a pair of films in the reflector region.

FIG. 7 is a graph showing a reflection spectrum when the film structure including the pair of films 137a and 137b has the above dimensions and the above refractive index. As shown in FIG. 7, the film structure including the films 137a and 137b has a high reflectivity over a wide wavelength range. That is, the film structure that includes the films 137a and 137b functions as a high reflection (HR) film having a high reflectivity to light propagating in the first optical waveguide. This film structure including the pair of films 137a and 137b having a high reflectivity is suitably used for forming one optical reflector of a laser cavity in the semiconductor laser region 10.

In addition, in the optical reflector formed by the film structure including the pair of films 137a and 137b, it is not necessary to use a crystal end facet formed by cleaving the semiconductor substrate. Accordingly, the semiconductor laser region and the wavelength-monitoring region can be suitably and monolithically integrated on the same semiconductor substrate.

Figure 8A:
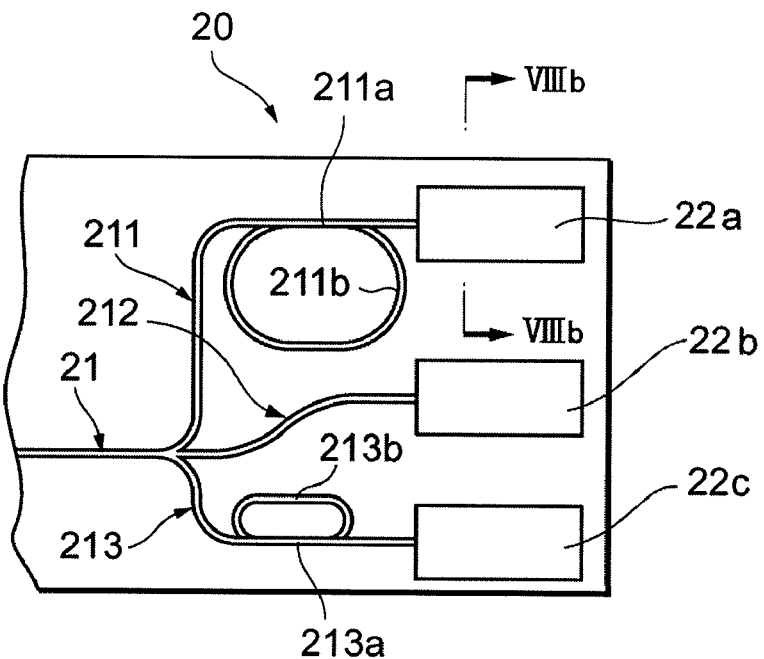
FIG. 8A is a plan view showing the structure of a wavelength-monitoring region.
Figure 8B:
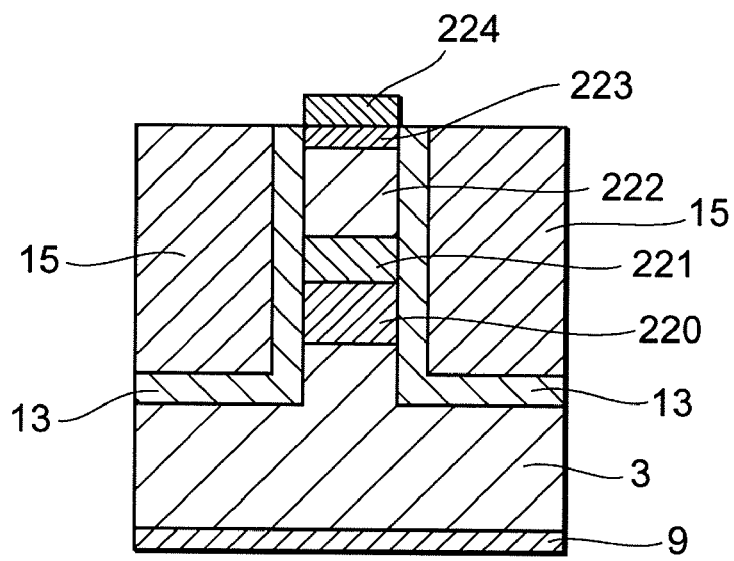
FIG. 8B is a cross-sectional view of the wavelength-monitoring region taken along line VIIIb-VIIIb in FIG. 8A and shows the structure of one of a plurality of photodiode structures provided in the wavelength-monitoring region.

Next, the structure of the wavelength-monitoring region 20 will be described with reference to FIGS. 1 and 2 and FIGS. 8A to 8C. FIG. 8A is a plan view showing the structure of the wavelength-monitoring region 20. FIG. 8B is a cross-sectional view of the wavelength-monitoring region 20 taken along line VIIIb-VIIIb in FIG. 8A and shows the structure of one of a plurality of photodiode structures 22a, 22b, and 22c in the wavelength-monitoring region 20. In FIG. 8B, the illustration of the temperature control device 30 shown in FIG. 2 is omitted.

The wavelength-monitoring region 20 includes an optical waveguide 21 and the plurality of photodiode structures 22a, 22b, and 22c. The optical waveguide 21 is a second optical waveguide in this embodiment. The optical waveguide 21 is optically coupled to the first optical waveguide (optical waveguide layers 110, 120, and 131) of the semiconductor laser region 10 with the pair of films 137a and 137b therebetween. The cross-sectional structure of the wavelength-monitoring region 20 perpendicular to the optical axis of the optical waveguide 21 is the same as the cross-sectional structure of the ring resonator region 10d (refer to FIG. 5A, the optical waveguide layer 131 corresponding to the optical waveguide 21), and thus a detailed description thereof is omitted.

As shown in FIG. 8A, the optical waveguide 21 is branched into optical waveguides 211, 212 and 213. The optical waveguides 211 includes a linear optical waveguide portion 211a and a ring-shaped portion 211b that is optically coupled to the optical waveguide portion 211a by using an MMI coupler. The optical waveguide 213 includes a linear optical waveguide portion 213a and a ring-shaped portion 213b that is optically coupled to the optical waveguide portion 213a by using an MMI coupler. Thus, each of the optical waveguides 211 and 213 forms a ring resonator. However, the optical waveguides 211 and 213 have optical path lengths different from each other. Another end of the optical waveguide portion 211a is coupled to the photodiode structure 22a and another end of the optical waveguide portion 213a is coupled to the photodiode structure 22c. Another end of the optical waveguide 212, which does not form a ring resonator, is coupled to the photodiode structure 22b.

Figure 8C:
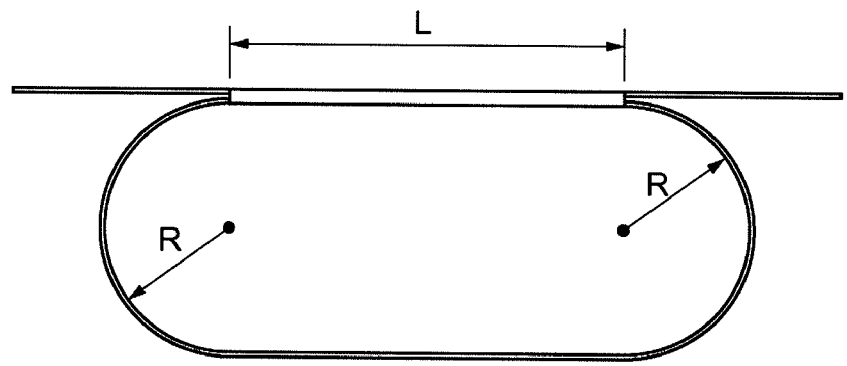
FIG. 8C is a view showing the structure of a ring resonator.

The optical waveguides 211 and 213 form ring resonators as described above. That is, the optical waveguides 211 and 213 form first ring resonators in this embodiment. Each of the optical waveguide 211 and 213 has transmission spectrum in which transmittance periodically changes with a predetermined period. The transmission spectrum of the ring resonator has periodic transmission peak wavelengths. The period of the transmission peak wavelengths of the ring resonator is determined by the optical path length of the ring resonator. Therefore, the transmission spectrum and the period of the transmission peak wavelengths of the optical waveguide 211 are different from those of the optical waveguide 213. The shorter the optical path length of the ring resonator, the longer the period of the transmission peak wavelengths. Here, a model of a ring resonator is shown in FIG. 8C. The ring resonator has a length L of the MMI coupler (MMI length L) and a bend radius R of the ring resonator as shown in FIG. 8C. For the optical waveguide 211, the MMI length L is set to be 50 µm, and the bend radius R is set to be 250 µm. On the other hand, for the optical waveguide 213, the MMI length L is set to be 50 µm, and the bend radius R is set to be 10 µm.

Figure 9:
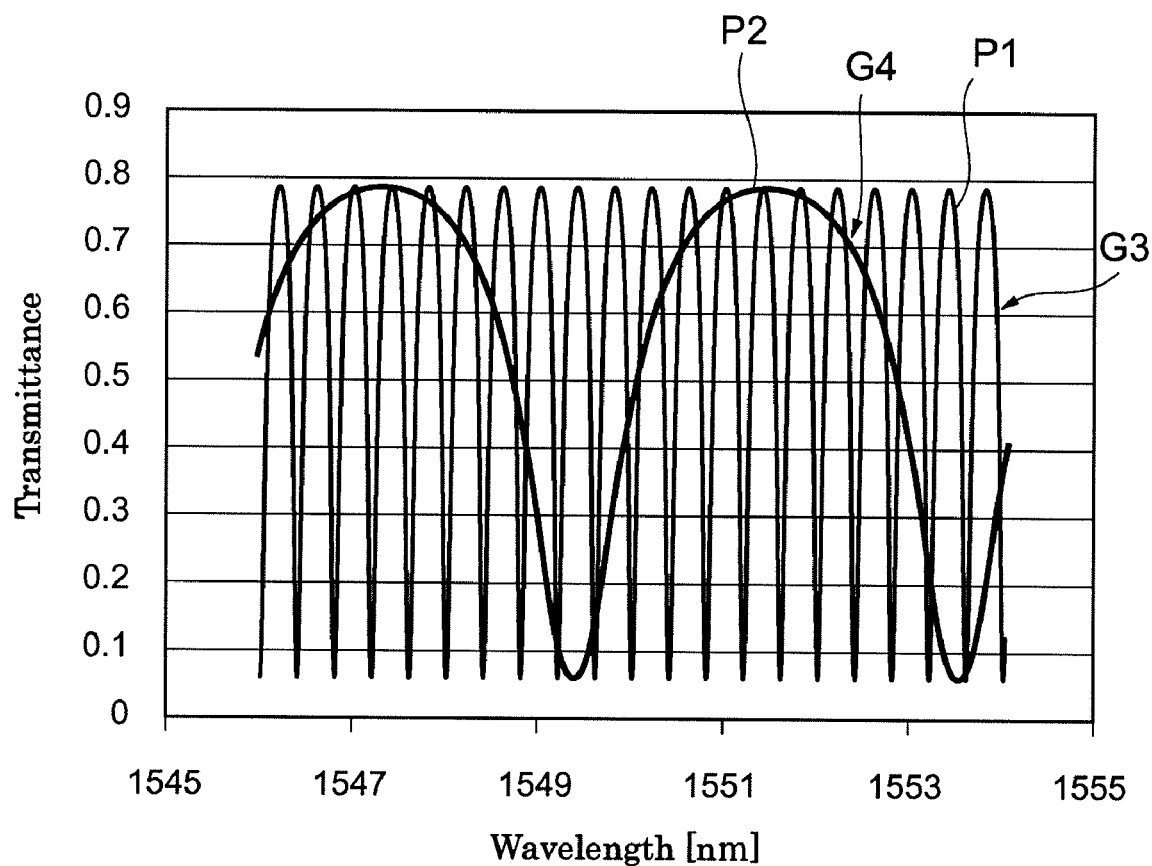
FIG. 9 is a graph showing an example of transmission spectra of ring resonators in the wavelength-monitoring region.

FIG. 9 is a graph showing an example of transmission spectra of the ring resonators formed by the optical waveguide 211 and 213, respectively. In FIG. 9, the vertical axis represents light transmittance and the horizontal axis represents the wavelength. As shown in FIG. 9, in the transmission spectrum of the ring resonator formed by the optical waveguide 211 (graph G3), transmission peaks P1 are periodically repeated. The period of the transmission peaks P1 is a period corresponding to the wavelength grid in a WDM optical transmission system (preferably, the same as the wavelength grid or a half of the wavelength grid), and is, for example, 50 GHz in terms of the frequency. Also, in the transmission spectrum of the ring resonator formed by the optical waveguide 213 (graph G4), transmission peaks P2 are periodically repeated. The period of the transmission peaks P2 is longer than that of the transmission peaks P1. The period of the transmission peaks P2 is wider than the wavelength grid in the WDM optical transmission system (preferably, two times or more the wavelength grid) and is, for example, 518 GHz in terms of the frequency. The periods of the transmission peaks in the transmission spectra of the optical waveguides 211 and 213 are different from each other. Preferably, the period of the transmission peaks in the optical waveguide 213 is more than two times the period of the transmission peaks in the optical waveguide 211.

As shown in FIG. 8B, each of the photodiode structures 22a, 22b and 22c includes an optical waveguide layer 220 provided on the semiconductor substrate 3, a light-absorbing layer 221 provided on the optical waveguide layer 220, a cladding layer 222 provided on the light-absorbing layer 221, and a contact layer 223 provided on the cladding layer 222. Except for the light-absorbing layer 221, the structures of these layers are the same as those of the optical waveguide layer 131, the upper cladding layer 132, and the contact layer 133 of the above-described phase control region 10e (refer to FIG. 5A). The optical waveguide layer 220, the light-absorbing layer 221, the cladding layer 222, and the contact layer 223 have a stripe-shaped mesa structure, and both side faces thereof are covered with an insulating film 13. Furthermore, a resin layer 15 is provided along the two side faces of the stripe-shaped mesa structure. An end of the optical waveguide layer 220 is optically coupled to one of the optical waveguides 211, 212 or 213.

The light-absorbing layer 221 is provided between the optical waveguide layer 220 and the cladding layer 222. In one example, the light-absorbing layer 221 is composed of p-type InGaAs. The composition of the light-absorbing layer 221 is adjusted so as to absorb light emitted from the semiconductor laser region 10, for example, light having a wavelength in a 1.55-µm wavelength range. The light-absorbing layer 221 has a thickness of, for example, 50 nm.

An anode electrode 224 is provided on the contact layer 223 of each of the photodiode structures 22a, 22b and 22c. The anode electrode 224 is an ohmic electrode composed of, for example, Ti/Pt/Au.

The operation of the semiconductor laser 1A having the above structure will now be described. First, in the semiconductor laser 1A, the semiconductor laser region 10 and the wavelength-monitoring region 20 are divided by the pair of films 137a and 137b which works as an optical reflector. Light emitted from the gain waveguide (i.e., the optical waveguide layer 110 of the gain region 10a) of the semiconductor laser region 10 propagates in the optical waveguide in the semiconductor laser region 10 and is reflected at the optical reflector formed by the pair of films 137a and 137b. The reflected light passes through the gain waveguide again and is amplified. Then, light having a specific wavelength is reflected by the DBR region 10b. This is repeated to generate laser oscillation, and light is output as the laser beam from an end facet of the optical waveguide opposite the pair of films 137a and 137b. In this case, the optical reflector formed by the pair of films 137a and 137b and the reflector formed in the DBR region 10b form a laser cavity. Furthermore, a portion of light reaching the pair of films 137a and 137b passes through the pair of films 137a and 137b and reaches the wavelength-monitoring region 20. This light is branched into the three optical waveguides 211, 212 and 213. Lights propagating in the optical waveguides 211 and 213 pass through the ring resonators provided in the optical waveguides 211 and 213, respectively. Then, these lights passing through the ring resonators are detected by the photodiode structures 22a and 22c, respectively. Light propagating in the optical waveguide 212 is directly detected by the photodiode structure 22b.

Figure 10:
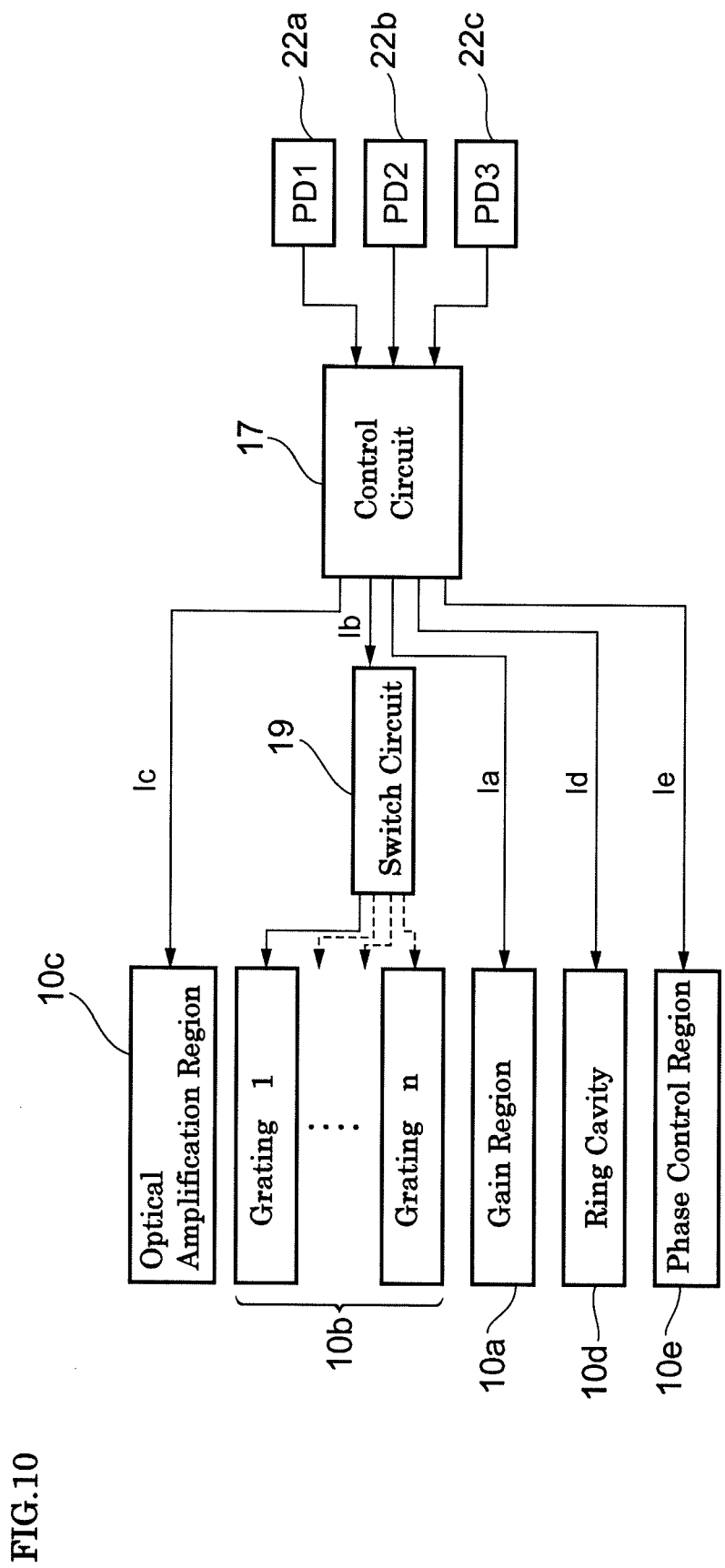
FIG. 10 is a block diagram that schematically shows a control system for controlling the emission wavelength of the semiconductor laser.

FIG. 10 is a block diagram that schematically shows a control system for controlling the wavelength of light emitted from the semiconductor laser 1A. As shown in FIG. 10, photocurrents taken from the three photodiode structures 22a, 22b and 22c are provided to a control circuit 17. The control circuit 17 carries out a predetermined operation, determines currents $I_a$ to $I_e$ that are supplied to electrodes of the gain region 10a, the DBR region 10b, the optical amplification region 10c, the ring resonator region 10d, and the phase control region 10e, and outputs the currents $I_a$ to $I_e$. The current $I_a$ output from the control circuit 17 is supplied to the anode electrode 114 of the gain region 10a. The current $I_b$ is selectively supplied to any of the plurality of anode electrodes 124 of the DBR region 10b through a switch circuit 19. The current $I_c$ is supplied to the anode electrode 115 of the optical amplification region 10c. The current $I_d$ is supplied to the anode electrode 134 of the ring resonator region 10d. The current $I_e$ is supplied to the anode electrode 135 of the phase control region 10e.

Figure 11:
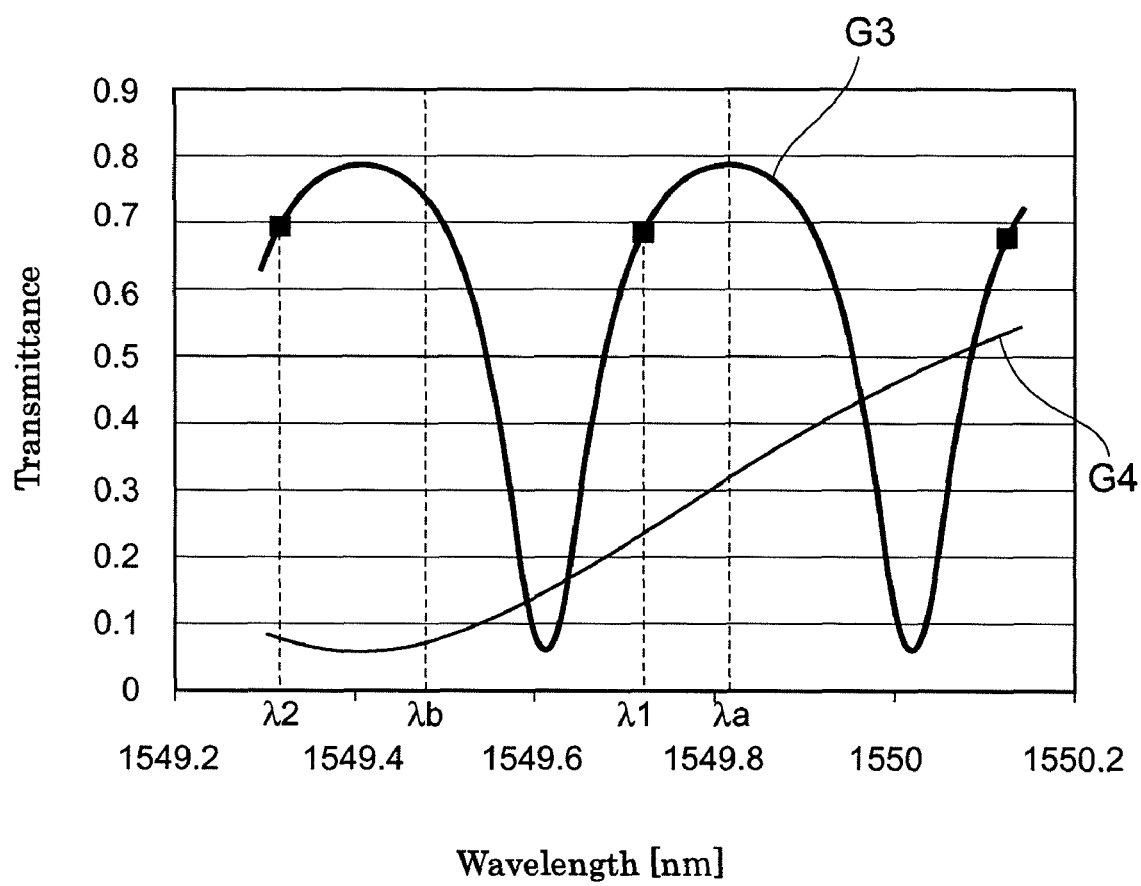
FIG. 11 is a graph that schematically illustrates the processing of a control circuit.

FIG. 11 is a graph that schematically illustrates the processing of the control circuit 17. In FIG. 11, the vertical axis represents the light transmittance and the horizontal axis represents the wavelength. In FIG. 11, graph G3 shows light transmission characteristics of the optical waveguide 211 in the wavelength-monitoring region 20, and graph G4 shows light transmission characteristics of the optical waveguide 213. Now, it is supposed that the lasing wavelength of the semiconductor laser region 10 is adjusted to a wavelength λ1. The control circuit 17 refers to a lookup table that is stored in advance and determines the currents $I_a$ to $I_e$ so that the lasing wavelength approaches the wavelength λ1. In this step, the lasing wavelength of the semiconductor laser region 10 becomes, for example, λa near the wavelength λ1. When a fine adjustment is necessary, the currents $I_a$ to $I_e$ are further adjusted so that the transmittance of light that passes through the optical waveguide 211 and that reaches the photodiode structure 22a approaches a value (about 0.69 in FIG. 11) corresponding to the wavelength λ1. This transmittance of light passing through the optical waveguide 211 is calculated on the basis of the ratio of light intensity detected by the photodiode structure 22a to light intensity detected by the photodiode structure 22b.

When the cavity length of the semiconductor laser region 10 is 1 mm, the longitudinal mode spacing of the laser cavity is as small as 42 GHz in terms of the frequency. In a semiconductor laser having such a small longitudinal mode spacing, jumping of lasing wavelength often occurs. This jumping of lasing wavelength is a so-called "mode hopping". This mode hopping may be caused by a change in the ambient temperature or the like. When a mode hopping occurs, the lasing wavelength is shifted to the adjacent longitudinal mode. For example, the lasing wavelength is shifted from the wavelength λ1 to a wavelength of the adjacent longitudinal mode (for example, the wavelength λb in FIG. 11) by the mode hopping. As shown in FIG. 11, in graph G3, the optical waveguide 211 has the same value of transmittance at a wavelength λ2 as that at the wavelength λ1. That is, the value of transmittance of the optical waveguide 211 at the wavelength λ2 is also about 0.69. When the variation in the lasing wavelength due to mode hopping is larger than the half period of the light transmission characteristics of the optical waveguide 211, the lasing wavelength approaches the wavelength λ2 by adjusting the currents $I_a$ to $I_e$ so that the transmittance approaches the predetermined value of 0.69. As a result, the lasing wavelength approaches not the wavelength λ1 but the wavelength λ2.

In such a case, by referring the transmittance of light that passes through the optical waveguide 213 and reaches the photodiode structure 22c (graph G4) in combination, the lasing wavelength can be suitably adjusted to the wavelength λ1. Specifically, in FIG. 11, the transmittance of the optical waveguide 213 corresponding to the wavelength λ1 is about 0.23, and the transmittance of the optical waveguide 213 corresponding to the wavelength λ2 is about 0.08. Accordingly, the control circuit 17 can adjust the currents $I_a$ to $I_e$ so that the transmittance of the optical waveguide 213 approaches 0.23. That is, the control circuit 17 adjusts the currents $I_a$ to $I_e$ so that the transmittances in the optical waveguides 211 and 213 approach respective predetermined values, whereby the lasing wavelength of the semiconductor laser region 10 can be reliably controlled with high accuracy even when mode hopping occurs.

As described above, in the semiconductor laser 1A of this embodiment, the periods of the transmission peaks in the transmission spectra of the ring resonators provided in the optical waveguide 211 and 213 are different from each other. Accordingly, even when the emission wavelength is varied by an amount corresponding to the FSR of one ring resonator, the variation in the wavelength can be corrected by monitoring the intensity of light passing through another ring resonator. That is, in the semiconductor laser 1A of this embodiment, even when the emission wavelength largely changes, the emission wavelength can be reliably controlled to a predetermined wavelength with high accuracy.

In the semiconductor laser 1A of this embodiment, the semiconductor laser region 10 and the wavelength-monitoring region 20 are provided on the single semiconductor substrate 3. Accordingly, a further reduction in size can be realized as compared with the conventional wavelength-locked laser diode.

As in this embodiment, the semiconductor laser region 10 includes the DBR region 10b, the ring resonator region 10d, and the phase control region 10e. The DBR region 10b has the diffraction grating 121a in which the grating period thereof changes in the light-propagation direction and a plurality of anode electrodes 124 arranged in the light-propagation direction. The ring resonator region 10d has a transmission spectrum that periodically changes with a predetermined period and that has a plurality of periodic transmission peaks. Accordingly, the semiconductor laser region 10 can have a wavelength-tunable laser structure. Consequently, the semiconductor laser 1A of this embodiment is suitable for the WDM optical transmission systems as a tunable light source.

A method for making the semiconductor laser 1A will now be described. First, a first semiconductor layer and a second semiconductor layer are sequentially grown on a semiconductor substrate 3 composed of, for example, n-type InP by a metal-organic vapor phase epitaxy (MOVPE) method. The first semiconductor layer is a semiconductor layer to be formed into optical waveguide layers 120, 131 and 220 and optical waveguides 21. The second semiconductor layer is a semiconductor layer to be formed into a diffraction grating layer 121 and a semiconductor layer 136. Next, a resist film is formed on the second semiconductor layer, and a diffraction grating pattern is formed on the resist film by an electron beam exposure technique. A diffraction grating 121a is formed by etching the diffraction grating layer 121 using the patterned resist film as an etching mask by dry etching process. The resist film is removed, and a p-type InP layer is then grown on the diffraction grating 121a by the MOVPE method so as to fill the diffraction grating 121a to form a part (having a thickness of about 200 nm) of upper cladding layers 122 and 132.

Subsequently, the semiconductor layers grown on a portion to be formed into a gain region 10a and on a portion to be formed into an optical amplification region 10c are removed by dry etching process. Next, an optical waveguide layer 110 and a part (having a thickness of about 200 nm) of an upper cladding layer 112 are grown by a butt-joint method on the portions of the semiconductor wafer from which the semiconductor layers have been removed. The optical waveguide layer 110 includes a lower optical confinement layer, an active layer having an MQW structure, and an upper optical confinement layer.

Next, the semiconductor layers (except for a layer to be formed into an optical waveguide layer 220) grown on portions to be formed into photodiode structures 22a, 22b and 22c are removed by dry etching process. Subsequently, a light-absorbing layer 221 and a part of a cladding layer 222 are grown on the portions that are removed by dry etching process.

Next, additional upper cladding layers 112, 122, 132, and 222 are formed at one time, and a semiconductor layer to be formed into contact layers 113, 123, 133, and 223 is successively grown by the MOVPE method. Subsequently, the contact layer between the portions to be formed into anode electrodes is removed so as to form a groove, thus electrically separating the anode electrodes from each other.

Next, portions corresponding to a ring resonator region 10d, a phase control region 10e, and a reflector region 10f, and a wavelength-monitoring region 20 are covered with a mask. Etching is then performed on portions corresponding to the gain region 10a, a DBR region 10b, and the optical amplification region 10c to a depth reaching the semiconductor substrate by using a stripe-shaped mask, thus forming a mesa structure. Subsequently, both side faces of the mesa structure are covered by a semi-insulating portion 102, and the mask is then removed. The stripe mask is made of, for example, $SiO_2$ or SiN.

Subsequently, portions corresponding to the gain region 10a, the DBR region 10b, and the optical amplification region 10c are covered with a mask. Etching is then performed on portions corresponding to the ring resonator region 10d, the phase control region 10e, the reflector region 10f, and the wavelength-monitoring region 20 to a depth reaching the semiconductor substrate so as to form a mesa structure. At the same time, a pair of grooves is formed in the portion to be formed into the reflector region 10f so as to cross the optical waveguide of the mesa structure. Subsequently, an insulating material such as $SiO_2$ is deposited on both side faces of this mesa structure and inside the pair of grooves by chemical vapor deposition (CVD) to form an insulating film 13 and an optical reflector including a pair of films 137a and 137b. Next, a BCB resin is applied by spin coating and cured to form a resin layer 15. The mask is then removed.

Next, portions of the insulating film 13 and the resin layer 15 on which an anode electrode is to be arranged are removed to form openings, and anode electrodes 114, 115, 124, 134, 135, and 224 are formed into the openings by a lift-off method. In this step, wiring and electrode pads on the semiconductor laser are also formed. A cathode electrode 9 is further formed on the reverse face of the semiconductor substrate by metal evaporation method.

Lastly, the semiconductor wafer (substrate) is cleaved and one cleaved facet is coated with an AR film 105. Subsequently, the resulting wafer is divided into chips, and each of the chips is mounted on a temperature control device 30. Thus, the semiconductor laser 1A is produced.

SiN may be used as the material of the pair of films 137a and 137b instead of $SiO_2$. When a BCB resin is used as the material of the pair of films 137a and 137b, the step of depositing the insulating material may be omitted, and the BCB resin may be applied and cured.

Second Embodiment

Figure 12:
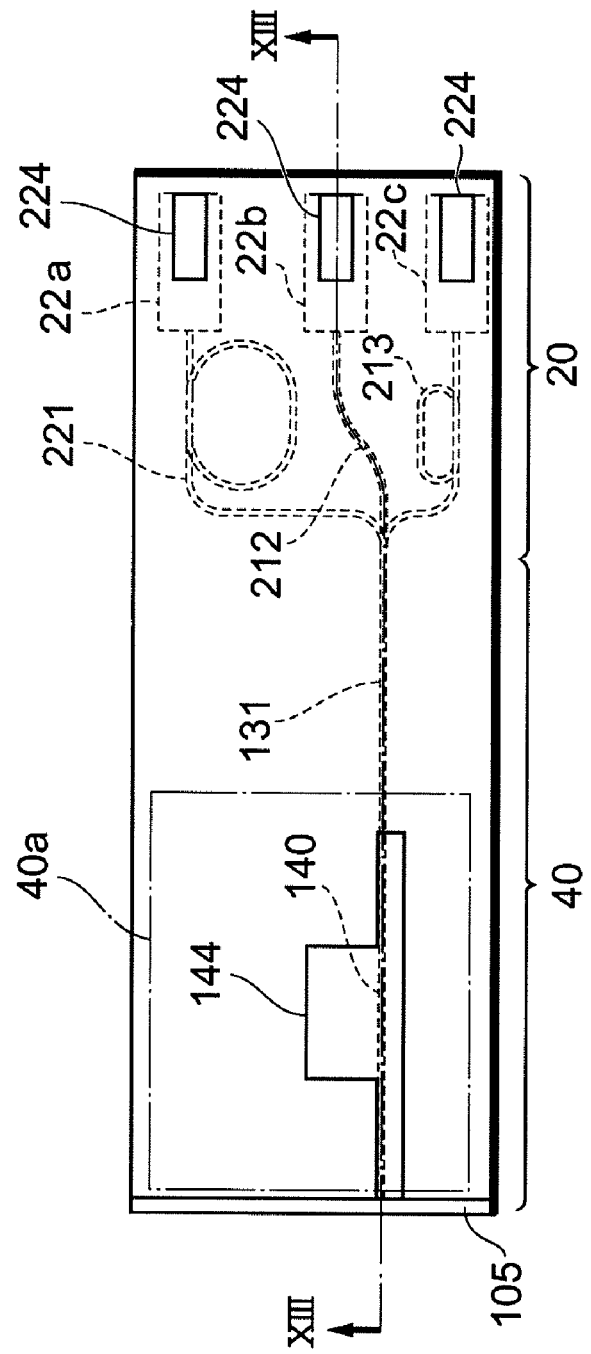
FIG. 12 is a plan view showing the structure of a semiconductor laser according to a second embodiment of the present invention.
Figure 13:
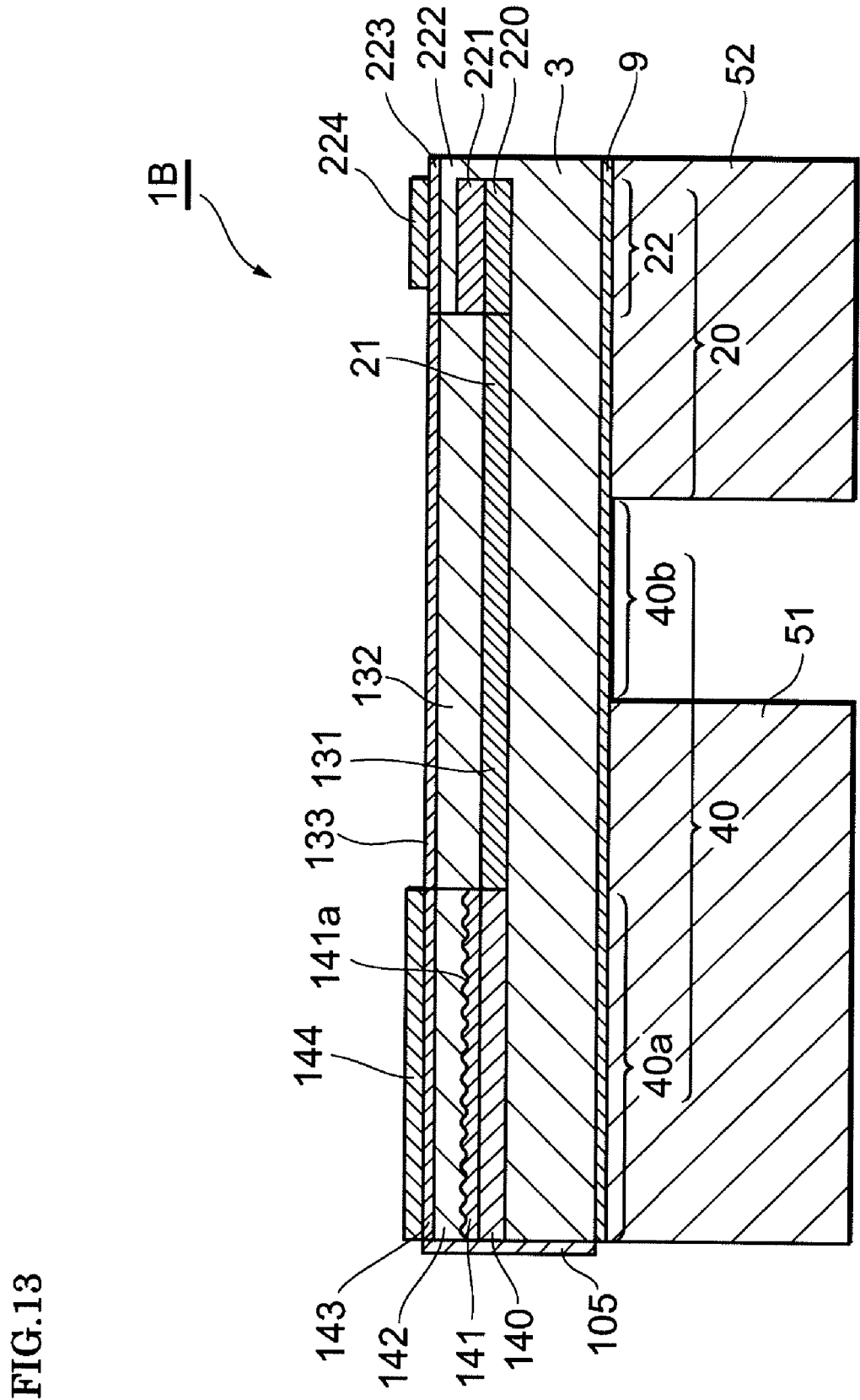
FIG. 13 is a cross-sectional side view of the semiconductor laser taken along line XIII-XIII in FIG. 12.

Next, a semiconductor laser according to a second embodiment of the present invention will now be described. Referring to FIGS. 12 and 13, a semiconductor laser 1B of this embodiment includes a semiconductor laser region 40 and a wavelength-monitoring region 20. The semiconductor laser region 40 has a distributed feedback (DFB) laser structure and includes a DFB laser region 40a and a coupling region 40b. The coupling region 40b is provided in order to optically couple the DFB laser region 40a to the wavelength-monitoring region 20. The structure and the function of the wavelength-monitoring region 20 are the same as those of the first embodiment.

As shown in FIG. 13, the semiconductor laser region 40 and the wavelength-monitoring region 20 are formed on a single semiconductor substrate 3 and arranged in the light-propagation direction. The semiconductor substrate 3 functions as a lower cladding layer of an optical waveguide in the semiconductor laser region 40 and the wavelength-monitoring region 20.

The semiconductor laser 1B is mounted on temperature control devices 51 and 52. For example, a Peltier device can be used as each of the temperature control devices 51 and 52. The temperature control device 51 is arranged right under the DFB laser region 40a, and the temperature control device 52 is arranged right under the wavelength-monitoring region 20. The temperature control device 51 and the temperature control device 52 independently control the temperature of the DFB laser region 40a and the temperature of the wavelength-monitoring region 20, respectively. That is, the temperature control device 51 appropriately changes the temperature of the DFB laser region 40a to adjust the emission wavelength, and the temperature control device 52 keeps the temperature of the wavelength-monitoring region 20 constant.

As shown in FIG. 13, the DFB laser region 40a includes an optical waveguide layer 140 provided on the semiconductor substrate 3, a diffraction grating layer 141, an upper cladding layer 142, and a contact layer 143 that are sequentially stacked on the optical waveguide layer 140. The optical waveguide layer 140 is a gain waveguide constituting a part of a first optical waveguide of this embodiment. The optical waveguide layer 140 includes, for example, a lower optical confinement layer provided on the semiconductor substrate 3, an active layer provided on the lower optical confinement layer, and an upper optical confinement layer provided on the active layer. The optical waveguide layer 140 is composed of a semiconductor having a band-gap wavelength longer than that of the semiconductor substrate 3 and extends in the light-propagation direction along the main surface of the semiconductor substrate 3. One end of the optical waveguide layer 140 is optically coupled to an AR film 105 provided on an end facet of the semiconductor laser 1B, and another end of the optical waveguide layer 140 is optically coupled to an optical waveguide layer (corresponding to the optical waveguide layer 131 shown in FIG. 6A) of the coupling region 40b.

The diffraction grating layer 141 is provided along the optical waveguide layer 140. In this embodiment, the diffraction grating layer 141 is provided directly on the optical waveguide layer 140. A diffraction grating 141a is formed at the interface between the diffraction grating layer 141 and the upper cladding layer 142. The diffraction grating 141a is formed along the optical waveguide layer 140, and the period of the diffraction grating is uniform.

In one example, the optical waveguide layer 140 and the diffraction grating layer 141 are each composed of undoped GaInAsP, and have thicknesses of, for example, 0.3 μm and 50 nm, respectively. The upper cladding layer 142 is composed of p-type InP, and the contact layer 143 is composed of p-type GaInAs. The upper cladding layer 142 and the contact layer 143 have thicknesses of, for example, 2 μm and 0.2 μm, respectively.

As in the gain region 10a of the first embodiment, the DFB laser region 40a of this embodiment has a stripe-shaped mesa structure extending in the light-propagation direction. The width of the stripe-shaped mesa structure in a direction intersecting with the light-propagation direction is, for example, 1.5 μm. A semi-insulating portion composed of, for example, Fe-doped InP is provided on each side face of the stripe-shaped mesa structure.

An anode electrode 144 is provided on the contact layer 143. The anode electrode 144 is an ohmic electrode composed of, for example, Ti/Pt/Au. As in the first embodiment, the cathode electrode 9 is provided on the reverse face of the semiconductor substrate 3. A current is injected into the optical waveguide layer 140 through the anode electrode 144 and the cathode electrode 9.

Figure 14:
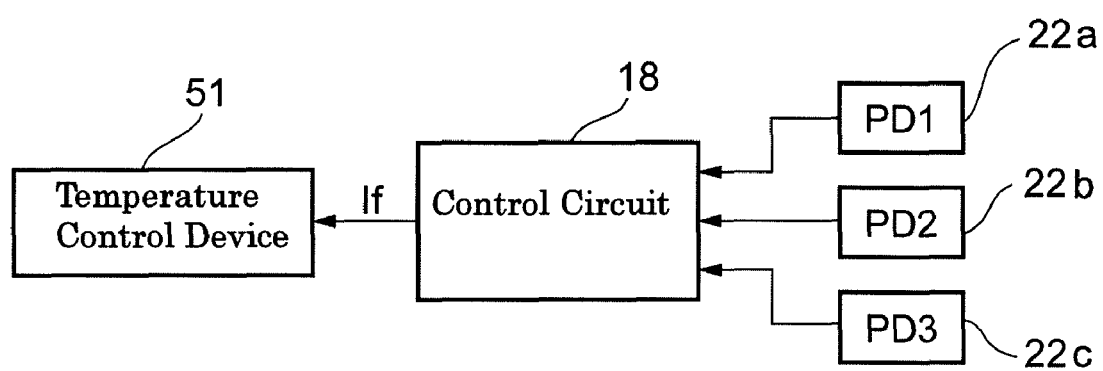
FIG. 14 is a block diagram that schematically shows a control system for controlling the emission wavelength of the semiconductor laser.

FIG. 14 is a block diagram that schematically shows a control system for controlling the wavelength of light emitted from the semiconductor laser 1B. As shown in FIG. 14, photocurrents taken from three photodiode structures 22a, 22b and 22c are provided to a control circuit 18. The control circuit 18 carries out a predetermined operation, determines a current $I_f$ that is supplied to the temperature control device 51, and outputs the current $I_f$. The temperature control device 51 changes the temperature of the DFB laser region 40a in accordance with the current $I_f$ provided from the control circuit 18. Thus, the refractive index of the optical waveguide layer 140 and the diffraction grating layer 141 is changed to control the emission wavelength of the DFB laser region 40a. As a result, the emission wavelength of the DFB laser region 40a can be controlled to a desired wavelength even if a circumstance temperature changes. Furthermore, the variation of emission wavelength of the DFB laser region 40a due to a long-term degradation can be suppressed. The operation carried out by the control circuit 18 is the same as that in the control circuit 17 of the first embodiment (refer to FIG. 11), and thus a detailed description thereof is omitted.

According to the semiconductor laser 1B of this embodiment, the same advantage as that in the semiconductor laser 1A of the first embodiment can be achieved. Specifically, even when the emission wavelength is varied by an amount corresponding to the FSR of one ring resonator, the variation in the wavelength can be corrected by monitoring the intensity of light passing through another ring resonator. According to the semiconductor laser 1B of this embodiment, even when the emission wavelength largely changes, the emission wavelength can be reliably controlled to a predetermined wavelength with high accuracy. According to the semiconductor laser 1B of this embodiment, the semiconductor region 40 and the wavelength-monitoring region 20 are provided on the semiconductor substrate 3. With this configuration, further reduction in size can be realized as compared with the conventional wavelength-locked semiconductor laser.

The semiconductor laser according to the present invention is not limited to the embodiments described above and various other modifications can be made. For example, in the above embodiments, InP compound semiconductors are exemplified as a semiconductor substrate and semiconductor layers. Alternatively, other group III-V compound semiconductors and other semiconductors can also suitably realize the structures of the present invention. In the above embodiments, a stripe-shaped mesa structure is exemplified as the structure of the first and second optical waveguides. Alternatively, optical waveguides having other structures such as a ridge structure can also suitably achieve the advantages of the present invention.

In the above embodiments, examples have been described in which the second optical waveguide is branched into three optical waveguides in the wavelength-monitoring region and two of the optical waveguides constitute the first ring resonators. However, the number of branches of the second optical waveguide is not particularly limited so long as the number is three or more. The advantages of the present invention can be suitably achieved when at least two optical waveguides among the branched optical waveguides constitute the first ring resonators.

The principle of the present invention has been described in the preferred embodiments with reference to the drawings. It is to be understood for those skilled in the art that the present invention can be changed in the arrangement and in the details without departing from the principle. The present invention is not limited to the specific structures disclosed in the embodiments. Accordingly, all modifications and changes derived from the scope of Claims and the scope of the spirit thereof are claimed.

What is claimed is:

1. A semiconductor laser comprising:
   a semiconductor laser region including a first optical waveguide that includes a gain waveguide, and a reflector region provided at one end of the first optical waveguide, the first optical waveguide extending in a light-propagation direction; and
   a wavelength-monitoring region including a second optical waveguide and photodiode structures that are optically coupled to the second optical waveguide, in the wavelength-monitoring region, the second optical waveguide being branched into three or more optical waveguides with at least two optical waveguides among the three or more optical waveguides forming first ring resonators having optical path lengths different from each other, wherein
   the first optical waveguide, the reflector region and second optical waveguide are arranged in the light-propagation direction,
   the reflector region is provided between the first optical waveguide and the second optical waveguide, and
   the first resonators are optically coupled between the photodiode structures and the first optical waveguide through the reflector region.

2. The semiconductor laser according to claim 1, wherein the reflector region includes a pair of films having a refractive index lower than the refractive index of the first optical waveguide, and
   wherein the pair of films extends in an in-plane direction perpendicular to an optical axis of the first optical waveguide, and forms an optical reflector of the first optical waveguide.

3. The semiconductor laser according to claim 2, wherein the pair of films is composed of at least one selected from $SiO_2$, SiN, and a benzocyclobutene resin.

4. The semiconductor laser according to claim 1, wherein the semiconductor laser region further includes
   a light reflection portion including a diffraction grating formed along the first optical waveguide and a plurality of electrodes on the diffraction grating arranged in the light-propagation direction of the first optical waveguide, the light reflection portion being provided at one end side of the gain waveguide,
   a light transmission portion provided at another end side of the gain waveguide, the light transmission portion having a plurality of transmission peaks that periodically change with a predetermined period, and
   a phase control portion for controlling the optical path length of the first optical waveguide, wherein
   the diffraction grating of the light reflection portion has a period that changes in a light-propagation direction of the first optical waveguide,
   the light reflection portion is provided at an another end of the first optical waveguide opposite to the one end of the first optical waveguide, and
   the light reflection portion and reflector region in the semiconductor laser region form a laser cavity.

5. The semiconductor laser according to claim 4, wherein the light transmission portion includes a second ring resonator formed by the first optical waveguide.

6. The semiconductor laser according to claim 1, wherein the period of transmission peak wavelengths in one of the first ring resonators formed by the at least two optical waveguides is more than two times the period of transmission peak wavelengths of another one of the first ring resonators.

7. The semiconductor laser according to claim 1, further comprising:
   a semiconductor substrate,
   wherein the semiconductor laser region and the wavelength-monitoring region are provided on the semiconductor substrate.

8. The semiconductor laser according to claim 1, wherein the semiconductor laser region has a distributed feedback laser structure including a diffraction grating formed along the gain waveguide.

9. The semiconductor laser according to claim 8, wherein the diffraction grating formed along the gain waveguide has a uniform period.

* * * * *